(12) United States Patent
Sia et al.

(10) Patent No.: US 12,379,395 B2
(45) Date of Patent: Aug. 5, 2025

(54) PROBES, PROBE BLADES, TOOLS FOR PROBE BLADES, BLADE HOLDERS, AND PROBE SYSTEMS FOR ELECTRICALLY TESTING A DEVICE UNDER TEST

(71) Applicant: FormFactor, Inc., Livermore, CA (US)

(72) Inventors: Choon Beng Sia, Singapore (SG); Yoichi Funatoko, Tokyo (JP); Isao Kunioka, Yokahama (JP); Masanori Watanabe, Tokyo (JP); Peter Andrews, Beaverton, OR (US); Ken Dawson, McMinnville, OR (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 18/762,393

(22) Filed: Jul. 2, 2024

(65) Prior Publication Data

US 2025/0020689 A1    Jan. 16, 2025

Related U.S. Application Data

(60) Provisional application No. 63/526,630, filed on Jul. 13, 2023.

(51) Int. Cl.
*G01R 1/067* (2006.01)
*G01R 1/02* (2006.01)
(Continued)

(52) U.S. Cl.
CPC ...... *G01R 1/06711* (2013.01); *G01R 31/2887* (2013.01); *G01R 31/2889* (2013.01)

(58) Field of Classification Search
CPC . G01R 1/02; G01R 1/04; G01R 1/067; G01R 1/073; G01R 31/00; G01R 31/02;
(Continued)

(56) References Cited

U.S. PATENT DOCUMENTS 3,812,311 A * 5/1974 Kvaternik ............. G01R 1/067
324/755.05
6,034,533 A * 3/2000 Tervo ................. G01R 1/06711
324/756.03
(Continued)

OTHER PUBLICATIONS

C. B. Sia, "True Kelvin CMOS Test Structure to Achieve Accurate and Repeatable DC Wafer-level Measurements for Device Modelling Applications", Proc. IEEE Intl Conf. on Microelectronics Test Structures, pp. 77-80, 2017, Grenoble France.

*Primary Examiner* — Neel D Shah
(74) *Attorney, Agent, or Firm* — KOLITCH ROMANO DASCENZO GATES LLC

(57) ABSTRACT

Probes, probe blades, tools for probe blades, blade holders, and probe systems for electrically testing a device under test (DUT). In some examples, the probe blades are configured to provide a Kelvin electrical connection with the DUT. In some examples, the probe blades include an alignment structure configured to engage with a blade holder when the probe blade is received within a blade-receiving region of the blade holder. The blade holders are configured to separably and operatively attach a probe blade to a probe system. In some examples, the blade holders include the probe blade. The probe systems are configured to electrically test the DUT and include the blade holder.

24 Claims, 30 Drawing Sheets

(51) Int. Cl.
*G01R 1/04*    (2006.01)
*G01R 1/073*   (2006.01)
*G01R 31/00*   (2006.01)
*G01R 31/28*   (2006.01)

(58) Field of Classification Search
CPC . G01R 31/28; G01R 31/2887; G01R 31/2889
See application file for complete search history.

(56)             References Cited

U.S. PATENT DOCUMENTS

| | | | |
|---|---|---|---|
| 6,232,789 B1 * | 5/2001 | Schwindt | G01R 1/06705 |
| | | | 324/754.07 |
| 6,384,615 B2 | 5/2002 | Schwindt | |
| 6,496,024 B2 | 12/2002 | Schwindt | |
| 6,850,082 B2 | 2/2005 | Schwindt | |
| 7,057,407 B2 | 6/2006 | Schwindt | |
| 7,221,174 B2 | 5/2007 | Schwindt | |
| 7,285,969 B2 * | 10/2007 | Hayden | G01R 1/06772 |
| | | | 324/755.02 |
| 7,432,728 B2 * | 10/2008 | Kilicaslan | G01R 1/07342 |
| | | | 324/756.03 |
| 7,504,842 B2 | 3/2009 | Schwindt | |
| 2009/0058445 A1 | 3/2009 | Leon | |
| 2013/0321018 A1 | 12/2013 | Gleason et al. | |
| 2021/0172978 A1 | 6/2021 | Funatoko et al. | |
| 2022/0299545 A1 | 9/2022 | Kunze et al. | |

\* cited by examiner

PROBES, PROBE BLADES, TOOLS FOR PROBE BLADES, BLADE HOLDERS, AND PROBE SYSTEMS FOR ELECTRICALLY TESTING A DEVICE UNDER TEST

RELATED APPLICATION

This application claims priority to U.S. Provisional Patent Application No. 63/526,630, which was filed on Jul. 13, 2023, and the complete disclosure of which is hereby incorporated by reference.

FIELD OF THE DISCLOSURE

The present disclosure relates generally to probes, probe blades, probe holders, and probe systems for electrically testing a device under test.

BACKGROUND OF THE DISCLOSURE

As integrated circuit devices trend toward higher and higher densities, contact pads, which are utilized to provide an electrical interface between the integrated circuit devices and a probe system that is configured to electrically test the integrated circuit devices, become proportionately smaller. For high-accuracy tests, it often is desirable to create a Kelvin, or at least a quasi-Kelvin, electrical connection between the probe system and the integrated circuit device. Conventional testing approaches utilize separate force and sense probes to contact a given contact pad during testing, thereby permitting the Kelvin electrical connection and providing independent verification of current flow through, and voltages at, the integrated circuit device. However, the above-described decrease in contact pad size makes it difficult, or even impossible, to contact separate force and sense probes with a single contact pad. In addition, because of the size constraints, conventional probes that are capable of forming the Kelvin electrical connection on progressively smaller contact pads have become progressively more expensive. Thus, there exists a need for improved probes, probe blades, blade holders, and/or probe systems for electrically testing a device under test.

SUMMARY OF THE DISCLOSURE

Probes, probe blades, tools for probe blades, blade holders, and probe systems for electrically testing a device under test (DUT). The probe blades include a dielectric blade body that is defined by a dielectric blade body material. The dielectric blade body includes a blade-mounting region and a probe-mounting region and defines a first blade side and an opposed second blade side. The probe blades also include a probe operatively attached to the probe-mounting region. The probe includes a probe tip configured to electrically contact the DUT.

In some examples, the probe blades further include a force electrically conductive trace that extends on the first blade side and between the blade-mounting region and the probe-mounting region. The force electrically conductive trace is in electrical communication with the probe within the probe-mounting region. In such examples, the probe blades also include a sense electrically conductive trace that extends on the first blade side and between the blade-mounting region and the probe-mounting region. In such examples, the probe blades further include an electrically conductive guard layer that extends on the opposed second blade side. In such examples, the probe blades are configured to provide a Kelvin electrical connection with the DUT.

In some examples, the probe blades further include an electrically conductive trace that extends between the blade-mounting region and the probe-mounting region and is in electrical communication with the probe within the probe-mounting region. In such examples, the probe blades also include an alignment structure configured to engage with a blade holder when the probe blade is received within a blade-receiving region of the blade holder. In such examples, the alignment structure includes a notch that extends into the probe blade and is configured to receive a region of the blade holder to facilitate consistent alignment between the probe blade and the blade holder and/or a protrusion that extends from an edge region of the probe blade and is configured to extend around a region of the blade holder to facilitate consistent alignment between the probe blade and the blade holder.

The blade holders include an electrically conductive holder housing and are configured to separably and operatively attach a probe blade to a probe system. The electrically conductive housing defines a blade-receiving region configured to receive the blade-mounting region of the probe blade. The electrically conductive housing also includes an electrical connection region configured to receive a plurality of electrical connections. The electrically conductive housing further includes a housing-mounting region configured to operatively attach the electrically conductive holder housing to the probe system. The electrically conductive housing also includes an at least partially enclosed housing volume that extends between the blade-receiving region and the electrical connection region. The blade holders also include a blade-contacting structure at least partially positioned within the blade-receiving region. The blade-contacting structure includes a force blade contact, which is configured to electrically contact the force electrically conductive trace, and a sense blade contact, which is configured to electrically contact the sense electrically conductive trace. The blade holders further include a ground electrical connection to the electrical connection region. The ground electrical connection is in electrical communication with the electrically conductive holder housing. The blade holders also include a force electrical connection within the electrical connection region. The force electrical connection is electrically isolated from the electrically conductive holder housing. The blade holders further include a force conductor that extends within the housing volume. The force conductor is electrically isolated from the electrically conductive holder housing and electrically interconnects the force electrical connection with the force blade contact. The blade holders also include a sense electrical connection to the electrical connection region. The sense electrical connection is electrically isolated from both the electrically conductive holder housing and the force electrical connection. The blade holders further include a sense conductor that extends within the housing volume. The sense conductor is electrically isolated from both the electrically conductive holder housing and the force conductor, and the second conductor electrically interconnects the sense electrical connection with the sense blade contact. In some examples, the blade holders further include the probe blade.

The probe systems are configured to electrically test a device under test (DUT) and include a chuck that defines a support surface configured to support a substrate that includes the DUT. The probe systems also include a probe assembly that includes the blade holder. The probe systems further include a manipulator configured to move the probe assembly relative to the support surface. The probe systems also include a signal generation and analysis assembly configured to provide a force signal to the DUT via the probe assembly and/or receive a sense signal from the DUT via the probe assembly. The probe systems further include an imaging device configured to collect an optical image of at least one other component of the probe system and/or of the DUT.

DETAILED DESCRIPTION AND BEST MODE OF THE DISCLOSURE

Figure 1:
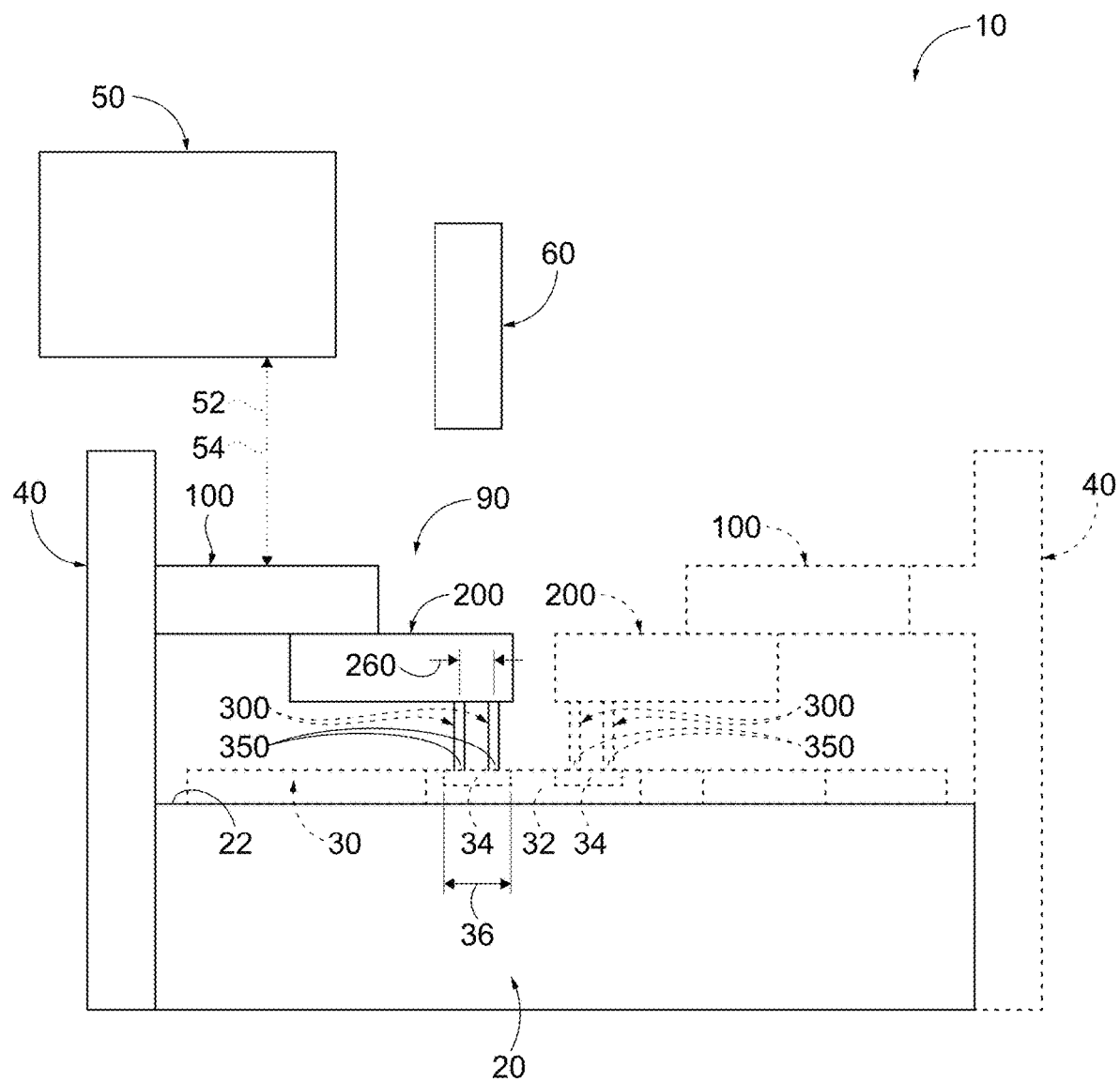
FIG. 1 is a schematic illustration of examples of a probe system according to the present disclosure.

FIGS. 1-30 provide examples of probe systems 10 of blade holders 100, of probe blades 200, of probes 300, and/or of tools 400, according to the present disclosure. Elements that serve a similar, or at least substantially similar, purpose are labeled with like numbers in each of FIGS. 1-30, and these elements may not be discussed in detail herein with reference to each of FIGS. 1-30. Similarly, all elements may not be labeled in each of FIGS. 1-30, but reference numerals associated therewith may be utilized herein for consistency. Elements, components, and/or features that are discussed herein with reference to one or more of FIGS. 1-30 may be included in and/or utilized with any of FIGS. 1-30 without departing from the scope of the present disclosure.

In general, elements that are likely to be included in a particular embodiment are illustrated in solid lines, while elements that are optional are illustrated in dashed lines. However, elements that are shown in solid lines may not be essential to all embodiments and, in some embodiments, may be omitted without departing from the scope of the present disclosure.

FIG. 1 is as schematic illustration of examples of probe systems 10 according to the present disclosure. Probe systems 10 may include a plurality of components that together may be utilized to test, or to electrically test, a device under test (DUT) 32. Probe systems 10 include a chuck 20. Chuck 20 may include and/or define a support surface 22, which may be configured to support a substrate 30 that includes DUT 32. Examples of chuck 20 include a vacuum chuck, a shielded chuck, an electromagnetically shielded chuck, and/or a temperature-controlled chuck.

Probe systems 10 also may include a probe assembly 90. Probe assembly 90, when present, may include a probe, examples of which are disclosed herein with reference to probe 300. Additionally or alternatively, probe assembly 90 may include a probe blade, examples of which are disclosed herein with reference to probe blade 200. Additionally or alternatively, probe assembly 90 may include a blade holder 100, examples of which are disclosed herein with reference to blade holder 100.

Probe 300 may include a probe tip 350, which may be configured to contact, or to electrically contact, DUT 32, such as via contact, or electrical contact, with a contact pad 34 of DUT 32. In some examples, and as illustrated, a given probe may include a plurality of probe tips 350, which may be configured to contact, or electrically contact, a single contact pad 34. In such a configuration, probe system 10 and/or probes 300 thereof may be configured to form a Kelvin connection with DUT 32.

As discussed in more detail herein, probe 300 may be operatively attached to probe blade 200. As also discussed in more detail herein, blade holder 100 may be configured to separably and operably attach probe blade 200 to a remainder of probe system 10. As an example, and as illustrated in FIG. 1, blade holder 100 may be operatively attached to a manipulator 40, which may be configured to move probe assembly 90 relative to support surface 22. Examples of manipulator 40 include a linear actuator, a rack and pinion assembly, a lead screw and nut assembly, a ball screw and nut assembly, a motor, a stepper motor, a servo motor, and/or a piezoelectric positioning assembly. It is within the scope of the present disclosure that manipulator 40 additionally or alternatively may be configured to move support surface 22 relative to probe assembly 90 and/or to move both support surface 22 and probe assembly 90. This may include motion along and/or about one, two, or three axes, which may be perpendicular and/or orthogonal to one another.

As also illustrated in FIG. 1, probe system 10 may include a signal generation and analysis assembly 50. Signal generation and analysis assembly 50 may be configured to provide a force signal 52 to DUT 32, such as via probe assembly 90 and/or contact pad 34. Additionally or alternatively, signal generation and analysis assembly 50 may be configured to receive a sense signal 54 from DUT 32, such as via probe assembly 90 and/or contact pad 34. Such a configuration may permit and/or facilitate four-terminal and/or Kelvin sensing of electric current flow through, and voltage across, DUT 32 by probe system 10. Examples of signal generation and analysis assembly 50 include a voltage source, a current source, an AC source, a DC source, a function generator, a voltmeter, a current meter, and/or an impedance analyzer.

As also illustrated in FIG. 1, probe system 10 may include an imaging device 60. Imaging device 60 may be configured to collect an image, or an optical image, of at least one other component of probe system 10, such as probe 300 and/or probe tip 350 thereof. Additionally or alternatively, imaging device 60 may be configured to collect the image of DUT 32. In a specific example, imaging device 60 may be configured to collect the image of contact pads 34 of DUT 32 and also of probe 300 and/or probe tip 350, such as to permit and/or to facilitate alignment between the probe tip and the contact pads. Examples of imaging device 60 include a camera, a digital camera, a video camera, a digital video camera, a microscope, and/or a digital microscope.

In some examples, and as illustrated in dashed lines in FIG. 1, probe system 10 may include a plurality of probe assemblies 90. In such a configuration, probe system 10 also may include a plurality of manipulators 40, with each manipulator 40 being configured to move a corresponding probe assembly 90 relative to support surface 22, such as to permit and/or to facilitate alignment and/or contact between one or more probes 300 of each probe assembly 90 and a corresponding contact pad 34 of DUT 32.

Figure 2:
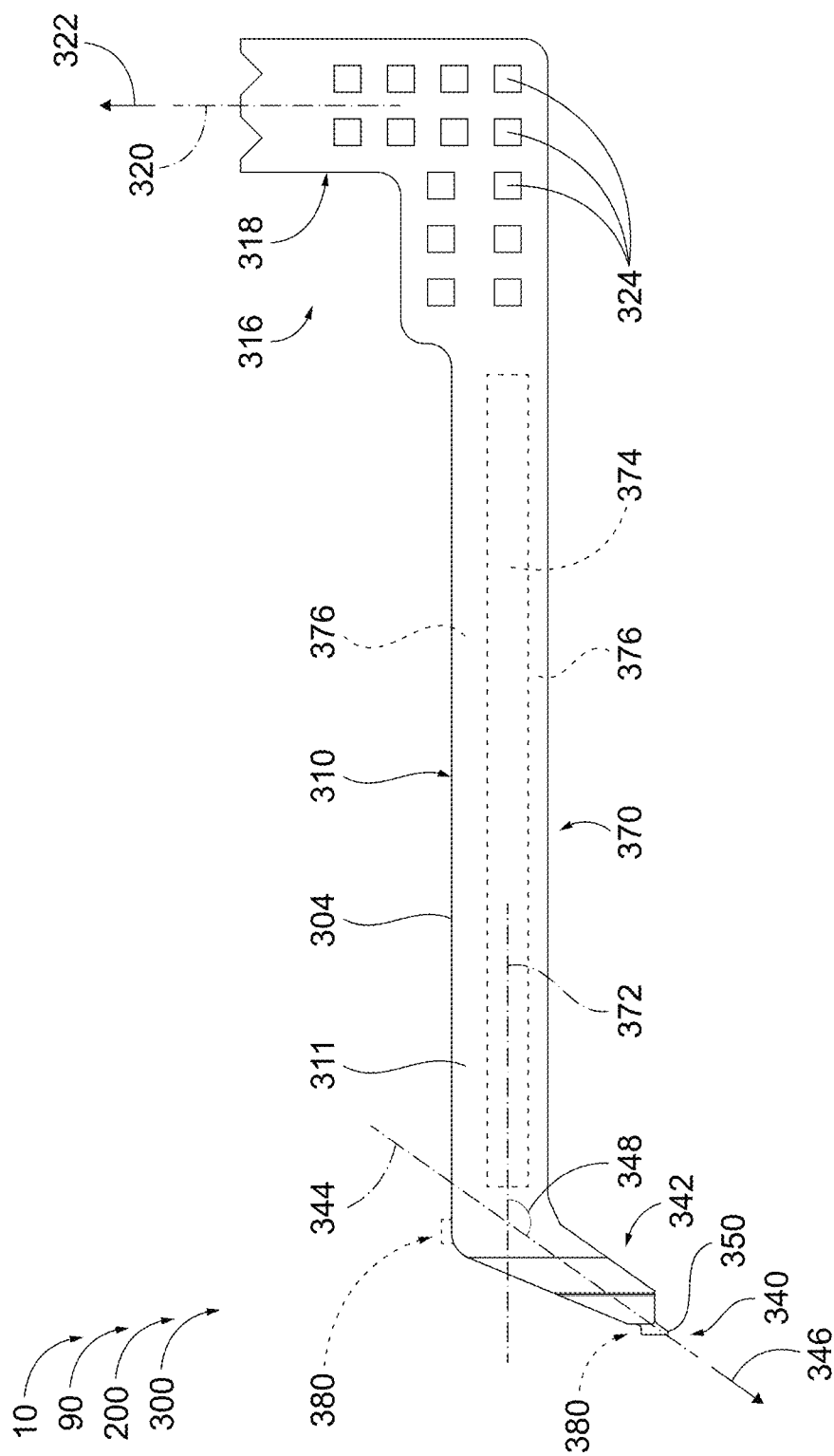
FIG. 2 is an illustration of examples of a probe according to the present disclosure.
Figure 3:
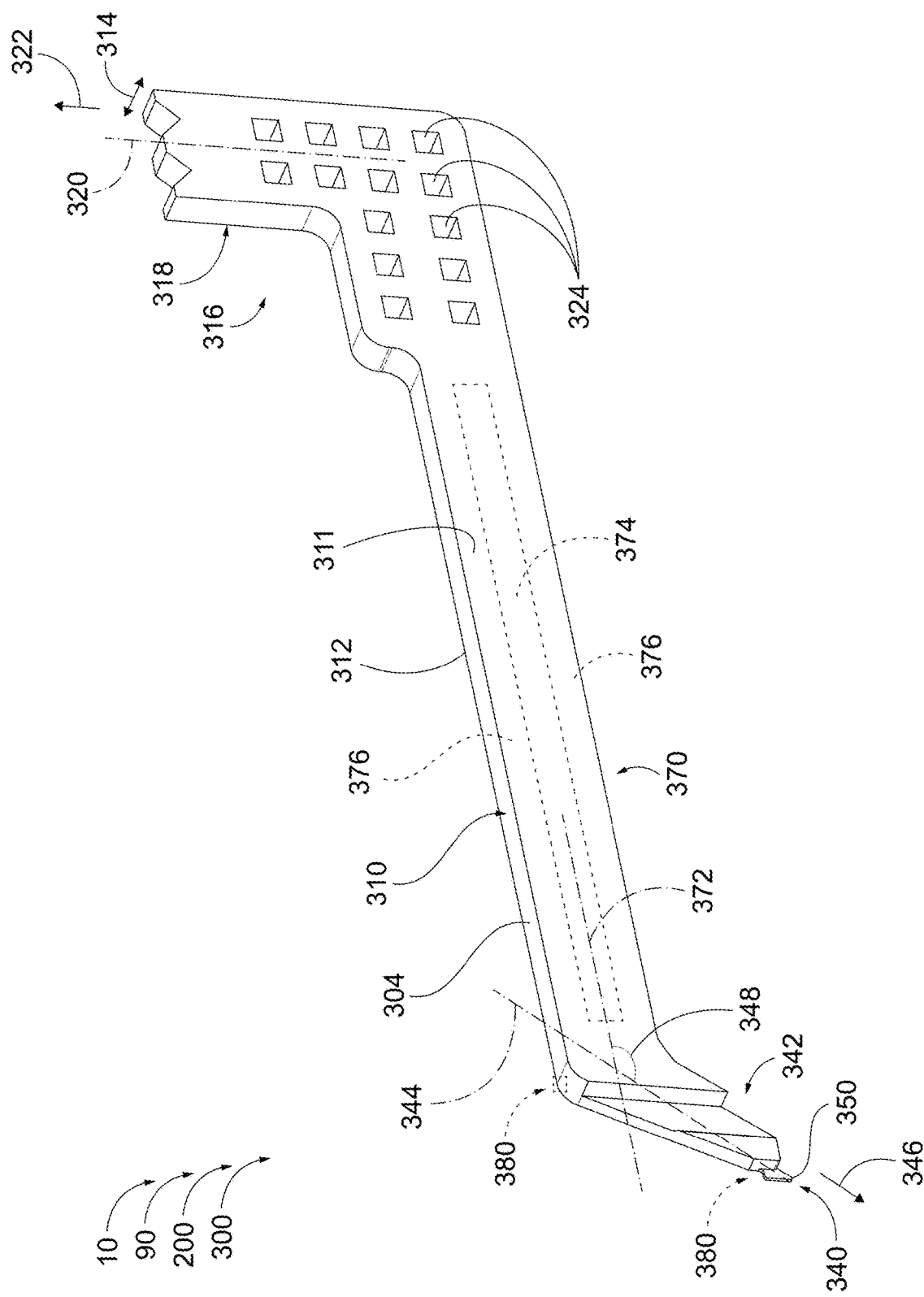
FIG. 3 is another illustration of the probe of FIG. 2.

FIGS. 2-3 are illustrations of examples of probes 300 according to the present disclosure. Probes 300 may include any suitable structure that may be adapted, configured, designed, and/or constructed to facilitate electrical testing of DUT 32 by probe system 10, such as via electrically contacting DUT 32, providing the force signal to DUT 32, and/or receiving the sense signal from DUT 32.

Probes 300, which are illustrated in FIGS. 2-3, may include and/or be more detailed illustrations of probes 300 that are illustrated in FIGS. 1, 4-22, and 24-25. With this in mind, any of the structures, functions, and/or features that are disclosed herein with reference to probes 300 of FIGS. 2-3 may be included in and/or utilized with probes 300 of FIGS. 1, 4-22, and/or 24-25 without departing from the scope of the present disclosure. Similarly, any of the structures, functions and/or features that are disclosed herein with reference to probes 300 of FIGS. 1, 4-22, and/or 24-25 may be included in and/or utilized with probes 300 of FIGS. 2-3 without departing from the scope of the present disclosure.

In the example that is illustrated in FIGS. 2-3, probes 300 include a unitary probe body 310 that is defined by an electrically conductive probe body material. The unitary probe body includes a probe mount 316, a tip region 340, and a beam region 370. Probe mount 316 is configured to be operatively attached to a probe blade, such as probe blade 200 that is discussed in more detail herein. Tip region 340 includes a probe tip 350 and is configured to electrically contact the DUT. Beam region 370 extends along a beam longitudinal axis 372 between probe mount 316 and tip region 340.

Unitary probe body 310 may include, may be formed from, and/or may be defined by any suitable electrically conductive probe body material. In a specific example, probe 300 and/or unitary probe body 310 thereof may be formed and/or defined by a micro electrical mechanical systems (MEMS) machining process. With this in mind, the electrically conductive probe body material may include and/or be a material that is suitable for the MEMS machining process. Examples of the electrically conductive probe body material include a metallic material, a semiconductor material, and/or a highly doped semiconductor material.

Unitary probe body 310 may include and/or be a planar, or at least substantially planar, unitary probe body. As an example, unitary probe body 310 may define a first probe side 311, an opposed second probe side 312, and a probe thickness 314, which may be measured between the first probe side and the second probe side. First probe side 311 may be a planar, or at least substantially planar, first probe side 311. Similarly, second probe side 312 may be a planar, or at least substantially planar, second probe side 312. The first probe side may extend parallel, or at least substantially parallel, to the second probe side.

Probe thickness 314 may have and/or define any suitable value. In general, probe thickness 314 may be less than a maximum extent of probe 300. As an example, a ratio of the maximum extent of probe 300 to probe thickness 314 may be within a threshold probe ratio range, examples of which include ranges of at least 20, at least 25, at least 30, at least 35, at least 40, at least 45, at least 50, at most 200, at most 150, at most 100, at most 90, at most 80, at most 70, at most 60, at most 50, and/or at most 40.

Probe mount 316 may be configured to be operatively attached to the probe blade, or to operatively attach the probe to the probe blade, in any suitable manner. As examples, probe mount 316 may be configured to be welded to the probe blade, brazed to the probe blade, soldered to the probe blade, and/or adhered to the probe blade, such as utilizing an electrically conductive adhesive material.

As illustrated in FIGS. 2-3, probe mount 316 may include a mounting tab 318. Mounting tab 318, when present, may project and/or extend away from beam longitudinal axis 372, such as via projection along a tab projection axis 320 and/or via projection in a probe mount extension direction 322. Tab projection axis 320 may extend perpendicular, or at least substantially perpendicular, to beam longitudinal axis 372 and/or probe mount extension direction 322 may extend parallel, or at least substantially parallel, to tab projection axis 320.

As also illustrated in FIGS. 2-3, probe mount 316 may include a plurality of region apertures 324. Region apertures 324 may extend through unitary probe body 310, such as between first probe side 311 and second probe side 312. This may include extension that is perpendicular to beam longitudinal axis 372 and/or that is perpendicular to tab projection axis 320. Region apertures 324 may increase a surface area of probe 300, thereby permitting and/or facilitating improved dissipation of heat from probe 300, such as may be generated by flowing an electric current through the probe.

Tip region 340 may include any suitable structure that includes probe tip 350 and/or that is adapted, configured, designed, and/or constructed to contact, or to electrically contact, the DUT. As illustrated in FIGS. 2-3, tip region 340 may include a tip projection 342, which may project from, or away from, beam region 370 and/or to probe tip 350, such as along a tip projection axis 344 and/or in a tip region extension direction 346. Tip projection axis 344 may extend at a tip projection angle 348 relative to beam longitudinal axis 372. Examples of tip projection angle 348 include angles of at least 90 degrees, at least 100 degrees, at least 110 degrees, at least 120 degrees, at least 130 degrees, at least 140 degrees, at most 160 degrees, at most 150 degrees, at most 140 degrees, at most 130 degrees, at most 120 degrees, at most 110 degrees, and/or at most 100 degrees. Such a configuration may permit and/or facilitate fabrication of probe assemblies 90 that include probe 300 and provide a target and/or desired overdrive-to-scrub ratio, examples of which are disclosed herein.

Tip region extension direction 346 may be at least partially opposed to probe mount extension direction 322. Stated differently, probe mount 316 and tip projection 342 both may extend away from beam region 370 and in opposed, or at least partially opposed, directions.

Beam region 370 may include any suitable structure that extends along beam longitudinal axis 372 and/or that extends between probe mount 316 and tip region 340. In some examples, beam region 370 may include and/or be a resilient beam region 370, such as may be configured to bend, to deform, and/or to deflect upon contact between probe tip 350 and the DUT. Such a configuration may permit and/or facilitate overdrive between the probe system and the DUT.

In some examples, and as illustrated in dashed lines in FIGS. 2-3, beam region 370 may include at least one longitudinal opening 374. Longitudinal opening 374 may extend at least partially along and/or at least partially parallel to beam longitudinal axis 372. Additionally or alternatively, longitudinal opening 374 may extend from first probe side 311, from second probe side 312, and/or between the first probe side and the second probe side.

Stated differently, beam region 370 may include a plurality of elongate beams 376, each of which may at least partially bound and/or surround at least one corresponding longitudinal opening 374. When beam region 370 includes the plurality of elongate beams, each elongate beam 376 may extend along and/or parallel to beam longitudinal axis 372 and/or may extend at least partially between probe mount 316 and tip region 340.

The plurality of elongate beams may include any suitable number of elongate beams together with a corresponding number of longitudinal openings. Examples of the plurality of elongate beams include at least 2, at least 3, at least 4, at least 5, at most 8, at most 6, and/or at most 4 elongate beams. More specific examples of the plurality of elongate beams include 2, 3, 4, 5, or 6 elongate beams.

Each elongate beam 376 may have and/or define any suitable shape. As examples, the elongate beams may define a rectangular transverse cross-sectional shape, an at least substantially rectangular transverse cross-sectional shape, a square transverse cross-sectional shape, and/or an at least substantially square transverse cross-sectional shape.

Longitudinal opening 374 may increase a flexibility of probe 300, such as in a deflection direction that may be parallel, or at least substantially parallel, to probe mount extension direction 322. Additionally or alternatively, longitudinal opening 374 may permit and/or facilitate fabrication of probe 300 with a target and/or desired compliance, such as in the deflection direction, and/or may permit and/or facilitate fabrication of probe assemblies 90 that include probe 300 and provide the target and/or desired overdrive-to-scrub ratio.

As illustrated in dashed lines in FIGS. 2-3, probe 300 may include a fiducial structure 380. Fiducial structure 380, when present, may be configured to be viewed by and/or visible to imaging device 60 of probe system 10, such as is illustrated in FIG. 1, during operative use of the probe system to electrically test the DUT. Stated differently, fiducial structure 380 may be at least partially defined on an upper surface 304 of probe 300. Such a configuration may permit and/or facilitate imaging and/or identification of the fiducial structure, thereby improving the probe system's ability to align the probe tip with the DUT.

In some examples, the fiducial structure may be positioned within tip region 340 and/or may be proximate tip region 340 relative to probe mount 316. Stated differently, a ratio of a fiducial-probe tip distance between the fiducial structure and the probe tip to the maximum extent of the probe may be less than a threshold distance ratio. Examples of the threshold distance ratio include 0.1, 0.08, 0.06, 0.04, 0.02, 0.01, 0.005, or 0.001. In some examples, fiducial structure 380 may be vertically, at least substantially vertically, and/or directly vertically above probe tip 350 during operative use of the probe system to electrically test the DUT. Stated differently, and when viewed from above via the imaging device, the probe tip may be immediately below the fiducial structure.

As discussed, probes 300 may be formed and/or defined via the MEMS machining process. With this in mind, methods of manufacturing and/or of forming probes 300 may include providing a MEMS substrate and utilizing at least one MEMS, or semiconductor, manufacturing process, to form probes 300 from, at least partially from, and/or on the MEMS substrate. Examples of the MEMS manufacturing process include a lithographic process, a deposition process, and/or an etch process.

FIGS. 4-16 are illustrations of examples of probe blades 200 according to the present disclosure. Probe blades 200 may include any suitable structure that may be adapted, configured, designed, and/or constructed to facilitate electrical testing of a DUT by the probe system, such as being operatively attached to and/or including a probe 300, conveying the force signal to the probe, receiving the sense signal from the probe, guarding the force signal and/or the sense signal, and/or operatively attaching the probe to the probe system.

Probe blades 200, which are illustrated in FIGS. 4-16, may include and/or be more detailed illustrations of probe blades 200 that are illustrated in FIGS. 1, 17-22, 24-25, and 30. With this in mind, any of the structures, functions, and/or features that are disclosed herein with reference to probe blades 200 of FIGS. 4-16 may be included in and/or utilized with probe blades 200 of FIGS. 1, 17-22, 24-25, and/or 30 without departing from the scope of the present disclosure. Similarly, any of the structures, functions and/or features that are disclosed herein with reference to probe blades 200 of FIGS. 1, 17-22, 24-25, and/or 30 may be included in and/or utilized with probe blades 200 of FIGS. 4-16 without departing from the scope of the present disclosure.

In the example of FIGS. 4-16, probe blade 200 includes a dielectric blade body 210, a probe 300, and an electrically conductive trace 240. Dielectric blade body 210 is defined by a dielectric blade body material and includes a blade-mounting region 220 and a probe-mounting region 230. Probe 300 is operatively attached to probe-mounting region 230 and includes a probe tip 350 that is configured to electrically contact the DUT. Electrically conductive trace 240 extends between blade-mounting region 220 and probe-mounting region 230 and is in electrical communication with probe 300 within the probe-mounting region.

Dielectric blade body 210 may include, may be formed from, and/or may be defined by any suitable dielectric blade body material. In a specific example, the dielectric blade body material includes and/or is a ceramic dielectric blade body material. In another specific example, the dielectric blade body material differs from the electrically conductive probe body material of probe 300.

Dielectric blade body 210 may include and/or be a planar, or at least substantially planar, dielectric blade body. As an example, dielectric blade body 210 may define a first blade side 211, an opposed second blade side 212, and a blade thickness 214, which may be measured between the first blade side and the second blade side. First blade side 211 may be a planar, or at least substantially planar, first blade side 211. Similarly, second blade side 212 may be a planar, or at least substantially planar, second blade side 212. The first blade side may extend parallel, or at least substantially parallel, to the second blade side.

Blade thickness 214 may have and/or define any suitable value. In general, blade thickness 214 may be less than a maximum extent of probe blade 200. As an example, a ratio of the maximum extent of probe blade 200 to blade thickness 214 may be within a threshold blade ratio range, examples of which include ranges of at least 20, at least 25, at least 30, at least 35, at least 40, at least 45, at least 50, at most 200, at most 150, at most 100, at most 90, at most 80, at most 70, at most 60, at most 50, and/or at most 40.

As illustrated, dielectric blade body 210 may be an L-shaped, or an at least partially L-shaped, dielectric blade body 210. Stated differently, blade-mounting region 220 may project from a remainder of the dielectric blade body along a blade-mounting region axis 222, and probe-mounting region 230 may project from a remainder of the dielectric blade body along a probe-mounting region axis 232 that differs from the blade-mounting region axis. An angle of intersection 234 between blade-mounting region axis 222 and probe-mounting region axis 232 may have and/or define any suitable value, examples of which include at least 30 degrees, at least 40 degrees, at least 50 degrees, at least 60 degrees, at least 70 degrees, at least 80 degrees, at least 90 degrees, at least 100 degrees, at most 150 degrees, at most 140 degrees, at most 130 degrees, at most 120 degrees, at most 110 degrees, at most 100 degrees, at most 90 degrees, and/or at most 80 degrees. Additionally or alternatively, blade-mounting region axis 222 and/or probe-mounting region axis 232 may extend parallel, or at least substantially parallel, to first blade side 211 and/or to second blade side 212.

Electrically conductive trace 240 may include any suitable structure that extends between blade-mounting region 220 and probe-mounting region 230 and/or that is in electrical communication with probe 300. In some examples, electrically conductive trace 240 may be defined by an electrically conductive trace material. The electrically conductive trace material may differ from the dielectric blade body material of dielectric blade body 210 and/or may differ from the electrically conductive probe body material of unitary probe body 310. An example of the electrically conductive trace material includes a metallic electrically conductive trace material.

Electrically conductive trace 240 may be supported by dielectric blade body 210 and/or by the dielectric blade body material thereof. As examples, electrically conductive trace 240 may be deposited on the dielectric blade body material, may be adhered to the dielectric blade body material, and/or may be operatively attached to the dielectric blade body material.

In some examples, electrically conductive trace 240 may include and/or be an elongate electrically conductive trace. In some examples, electrically conductive trace 240 may include and/or be an at least partially planar electrically conductive trace.

Probe 300 may include and/or be an electrically conductive probe. Probe 300 may be operatively attached to probe blade 200 in any suitable manner. As examples, probe 300 may be welded, brazed, soldered, and/or adhered to probe-mounting region 230 and/or to electrically conductive trace 240.

In some examples, electrically conductive trace 240 may extend at least partially, or even completely, on and/or along first blade side 211 of dielectric blade body 210, as illustrated in FIGS. 4, 7, 11, and 14. In such examples, probe blade 200 may include an electrically conductive guard layer 250 that may extend at least partially, or even completely, on and/or along the opposed second blade side 212 of dielectric blade body 210, as illustrated in FIGS. 5, 8, 12, and 15. Electrically conductive guard layer 250 may be configured to be maintained at a fixed, or at least substantially fixed, electrical potential, such as a ground potential, thereby protecting, guarding, and/or shielding electrically conductive trace 240 from electrical interference. In some examples, probe blade 200 may be referred to herein as including a plurality of electrically conductive traces 240, including at least one electrically conductive trace 240 that extends on first blade side 211 and another electrically conductive trace 240 that extends on second blade side 212, such as electrically conductive guard layer 250. Stated differently, electrically conductive guard layer 250 may be an electrically conductive trace 240.

Opposed second blade side 212 may define a second side surface area, and electrically conductive guard layer 250 may define a guard layer surface area that is a threshold surface area fraction of the second side surface area. Examples of the threshold surface area fraction include at least 50%, at least 60%, at least 70%, at least 80%, at least 90%, or at least 95%.

Electrically conductive guard layer 250 may be directly opposed to electrically conductive trace 240, such as across blade thickness 214 of probe blade 200, along at least a threshold trace length fraction of a length of the electrically conductive trace. Examples of the threshold trace length fraction include at least 70%, at least 75%, at least 80%, at least 85%, at least 90%, at least 95%, or at least 99%.

The electrically conductive guard layer may extend only on opposed second blade side 212 of dielectric blade body 210. Stated differently, electrically conductive guard layer 250 may be electrically isolated from electrically conductive trace 240 that extends on first blade side 211 via the dielectric blade body and/or may be spaced apart from the electrically conductive trace via the dielectric blade body along an entirety of the length of the electrically conductive trace.

As illustrated in FIGS. 4, 6-7, 9-10, 12, 14, and 16, probe blades 200 may include a first electrically conductive trace 241, which also may be referred to herein as a force electrically conductive trace 241, and a second electrically conductive trace 242, which also may be referred to herein as a sense electrically conductive trace 242. Both first electrically conductive trace 241 and second electrically conductive trace 242 may extend between blade-mounting region 220 and probe-mounting region 230 and/or may extend at least partially, or even completely, on first blade side 211.

In some examples, probe blades 200 are configured to permit and/or facilitate a Kelvin, or a true Kelvin, electrical connection between probe systems 10 and the DUT. In such a configuration, and as collectively illustrated by FIGS. 4-13, probe blade 200 may include a first probe 301, which includes a first probe tip 351, and a second probe 302, which includes a second probe tip 352. First probe 301 and second probe 302 both may be operatively attached to probe-mounting region 230, such as via corresponding probe mounts 316 thereof. In such a configuration, first electrically conductive trace 241 may be in electrical communication with first probe 301 within probe-mounting region 230, and second electrically conductive trace 242 may be in electrical communication with second probe 302 within probe-mounting region 230. However, first probe 301 and second probe 302 and/or first electrically conductive trace 241 and second electrically conductive trace 242 may be electrically isolated from one another within probe blade 200 and/or within an entirety of the probe blade. As an example, the second electrically conductive trace may be spaced apart from the first electrically conductive trace, such as via the dielectric blade body, along an entirety of a length of the first electrically conductive trace. As another example, the second electrically conductive trace may be electrically isolated from the first electrically conductive trace via the dielectric blade body. As another example, the first probe may be spaced apart from the second probe. As another example, the first probe may be electrically isolated from the second probe, such as via the dielectric body and/or via an air gap therebetween.

Figure 6:
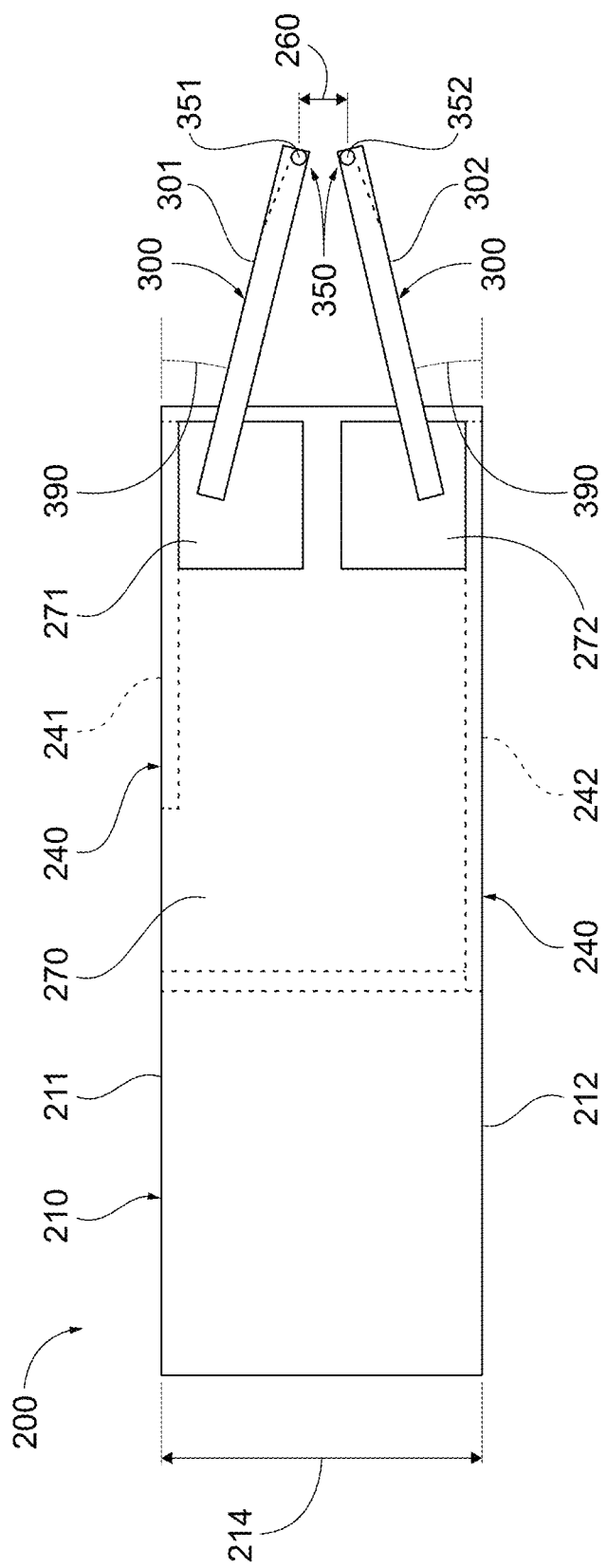
FIG. 6 is another illustration of a region of the probe blade of FIGS. 4-5.
Figure 7:
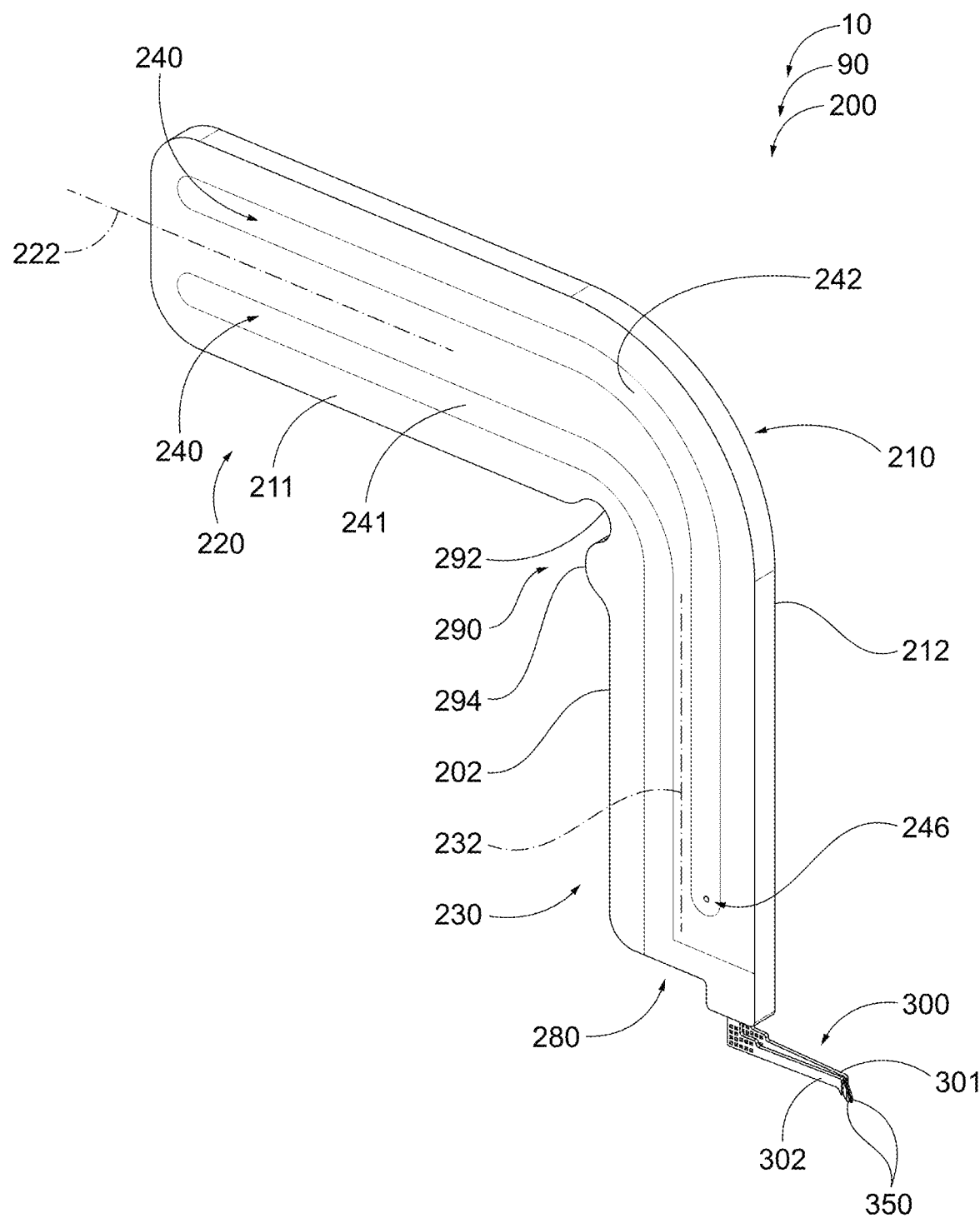
FIG. 7 is an illustration of an example of a probe blade that includes two probes and is configured to form a Kelvin connection with a device under test (DUT), according to the present disclosure.
Figure 8:
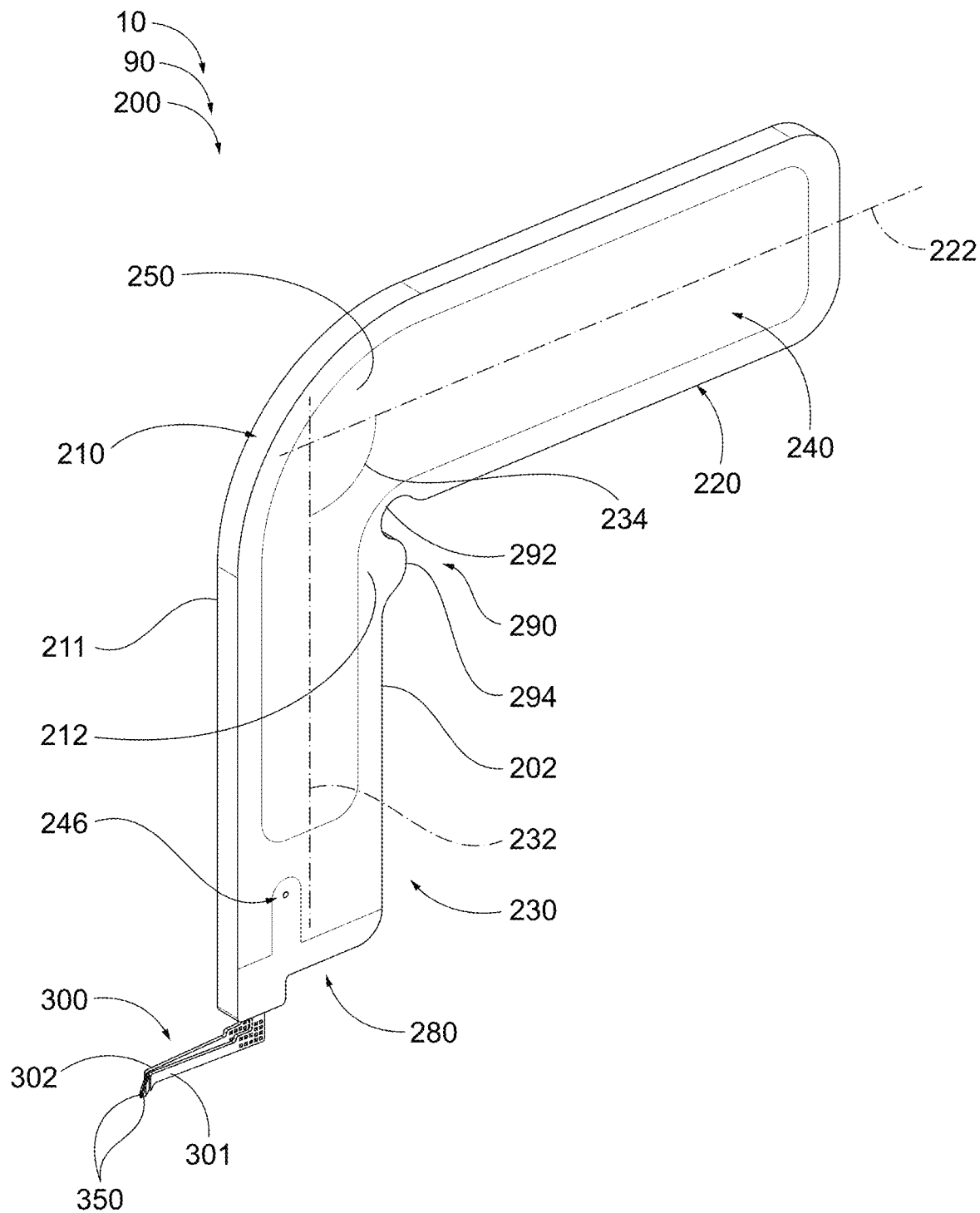
FIG. 8 is another illustration of the probe blade of FIG. 7.
Figure 13:
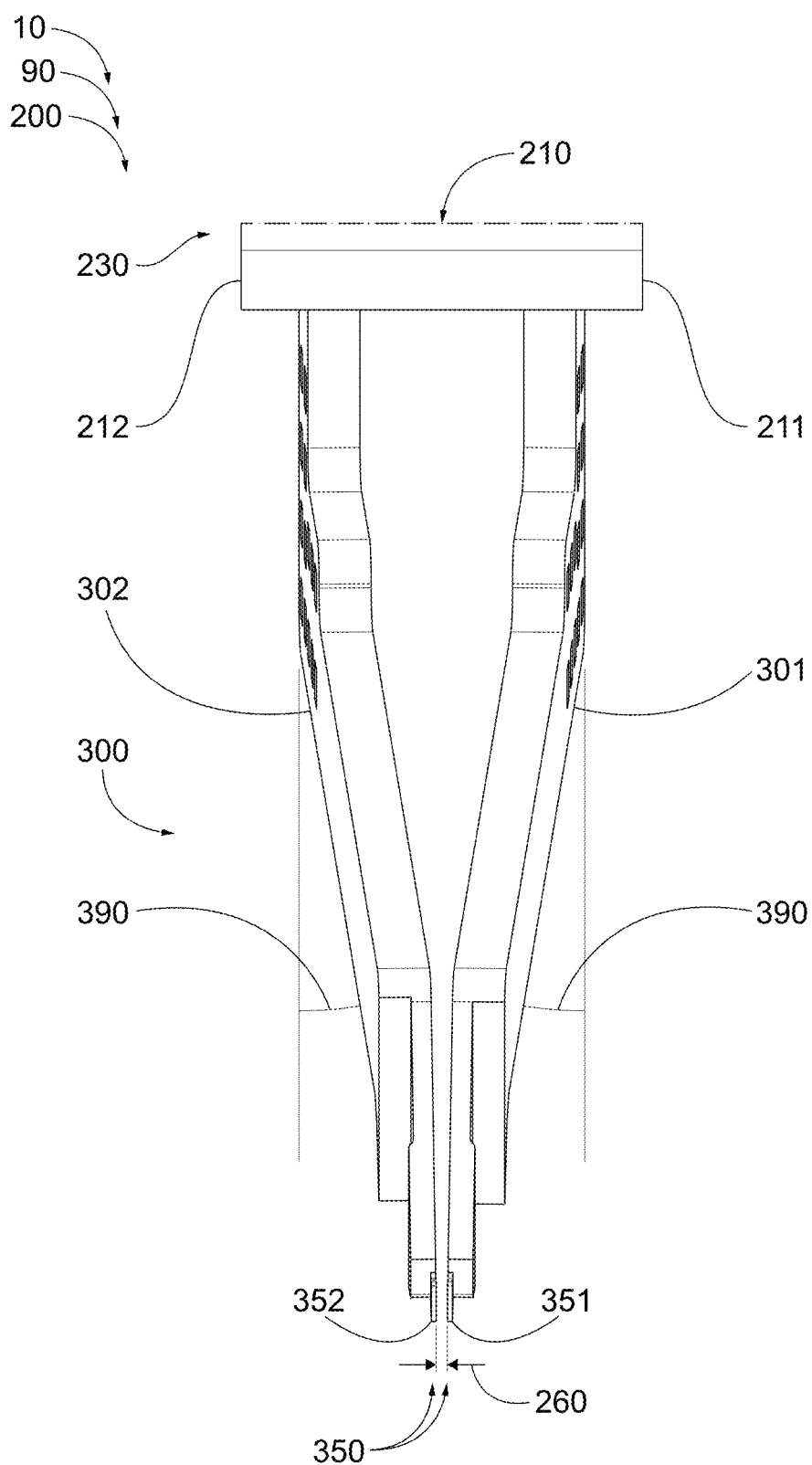
FIG. 13 is an illustration of an example of two probes that may be included in a probe blade, according to the present disclosure.
Figure 14:
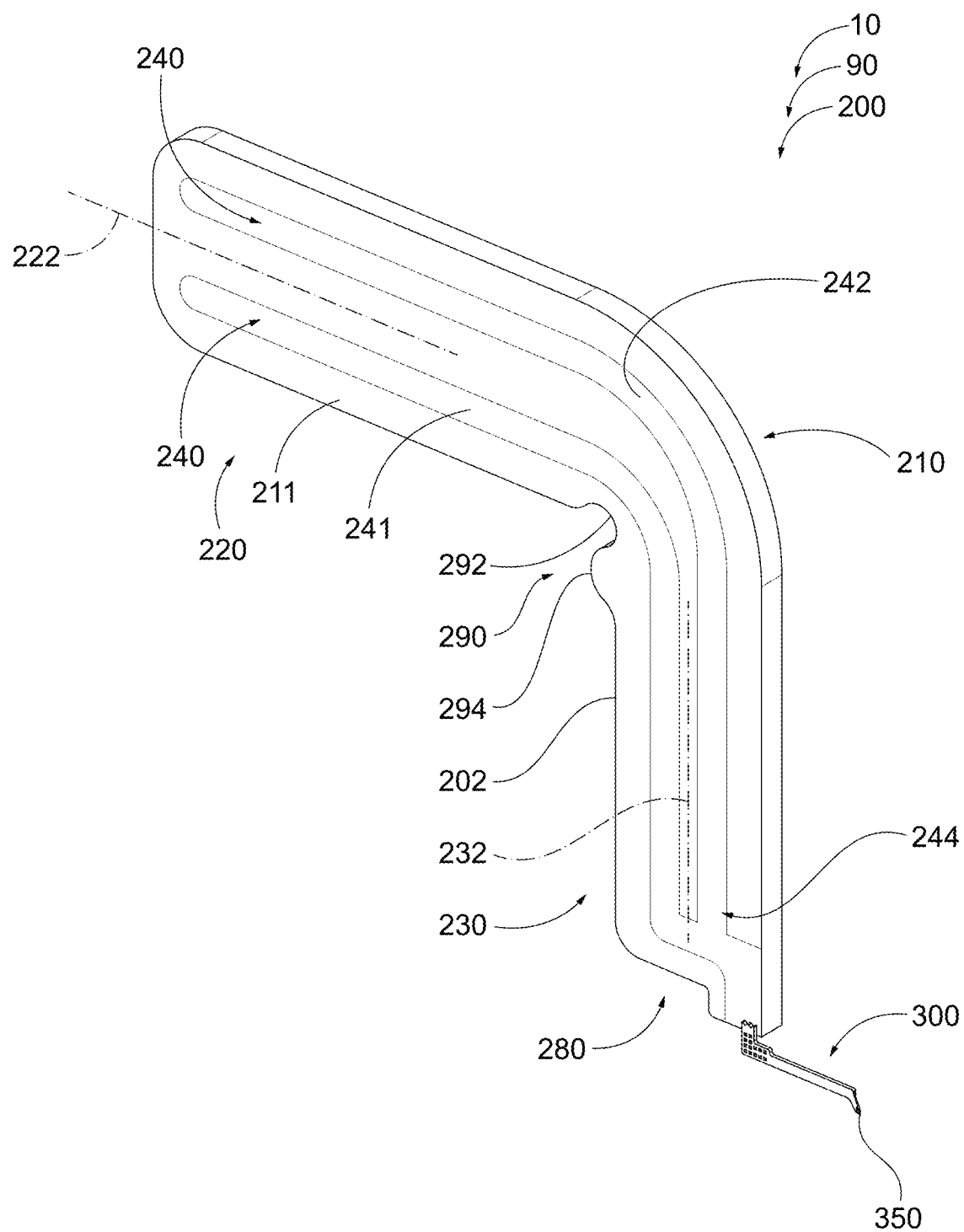
FIG. 14 is an illustration of an example of a probe blade that includes a single probe and is configured to form a quasi-Kelvin connection with a DUT, according to the present disclosure.
Figure 15:
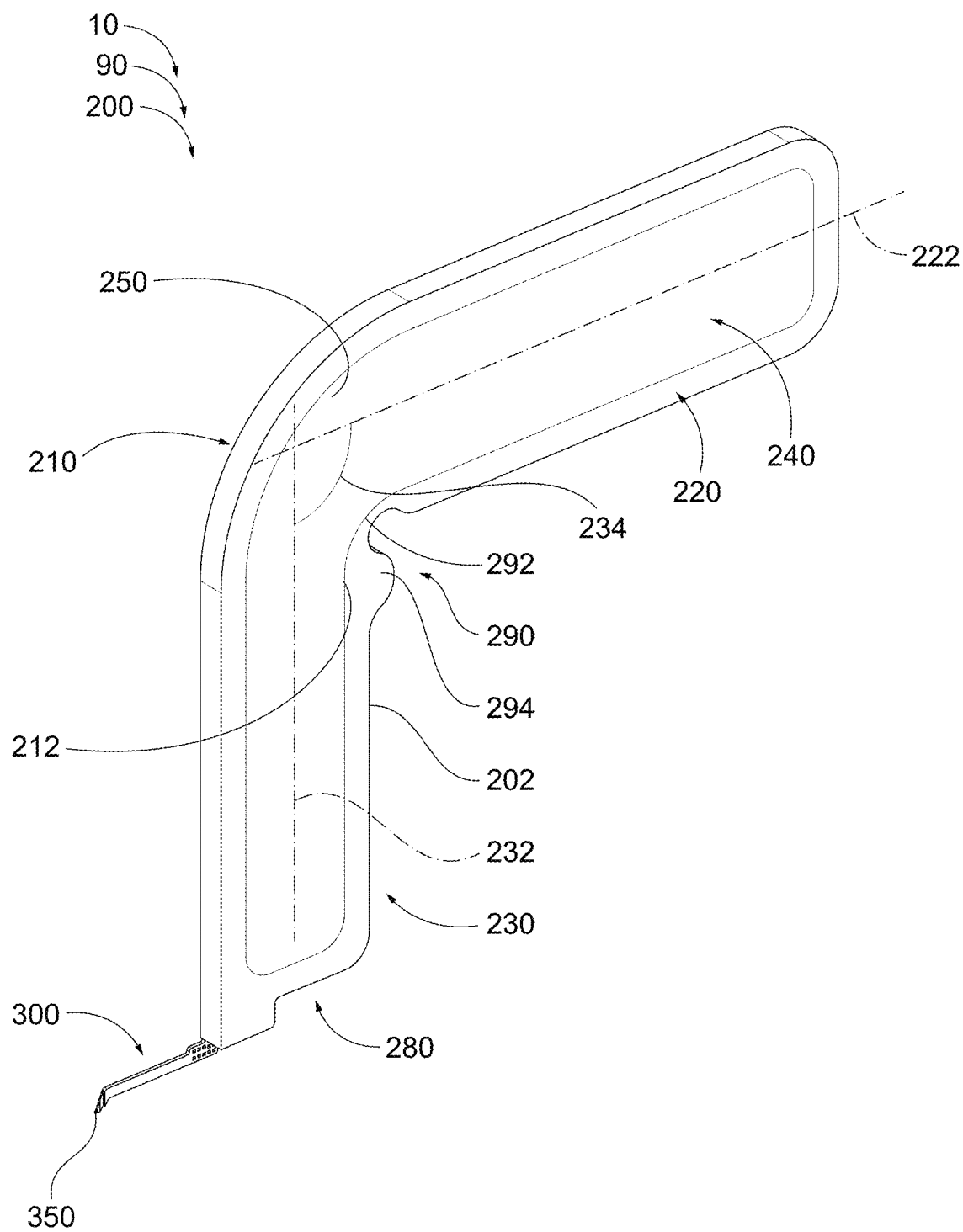
FIG. 15 is another illustration of the probe blade of FIG. 14.
Figure 16:
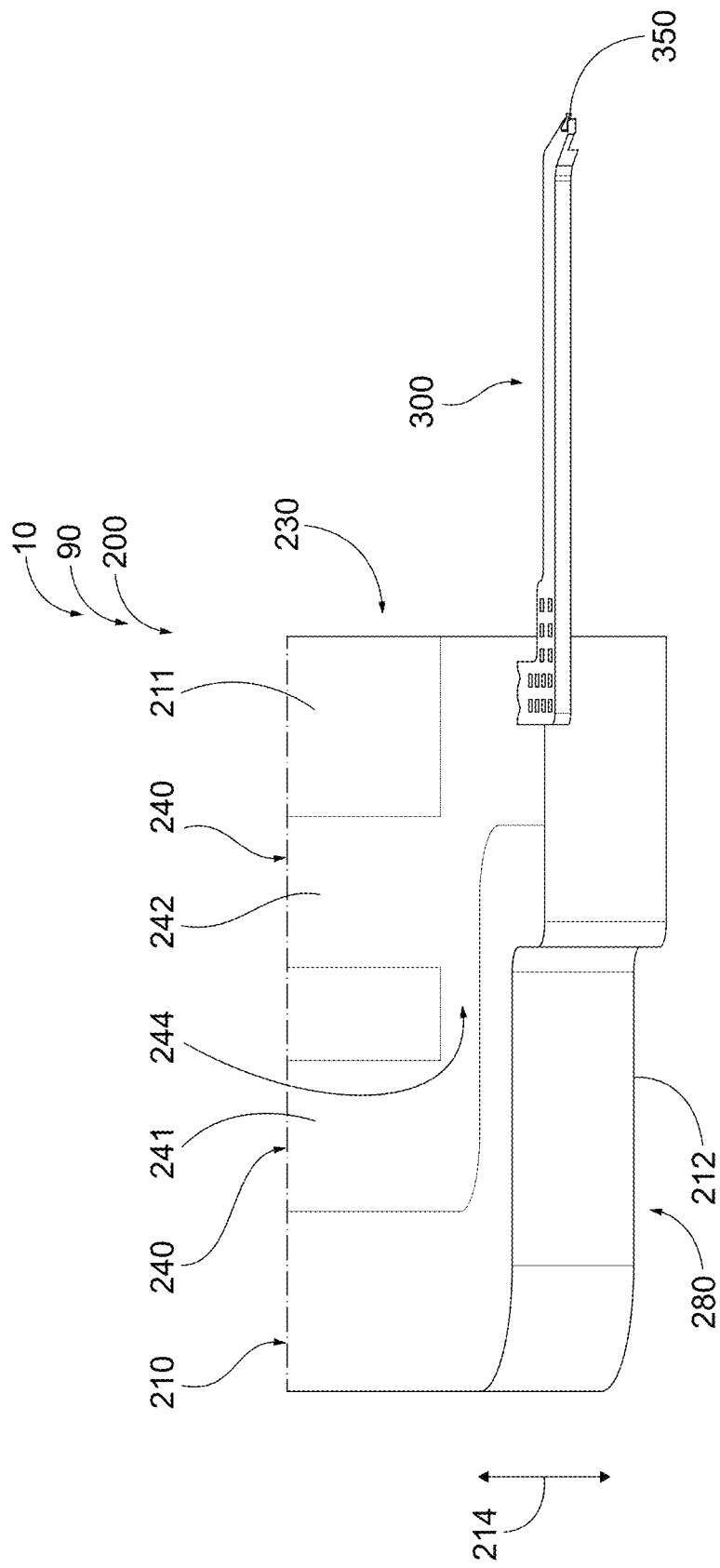
FIG. 16 is another illustration of a region of the probe blade of FIGS. 14-15.
Figure 17:
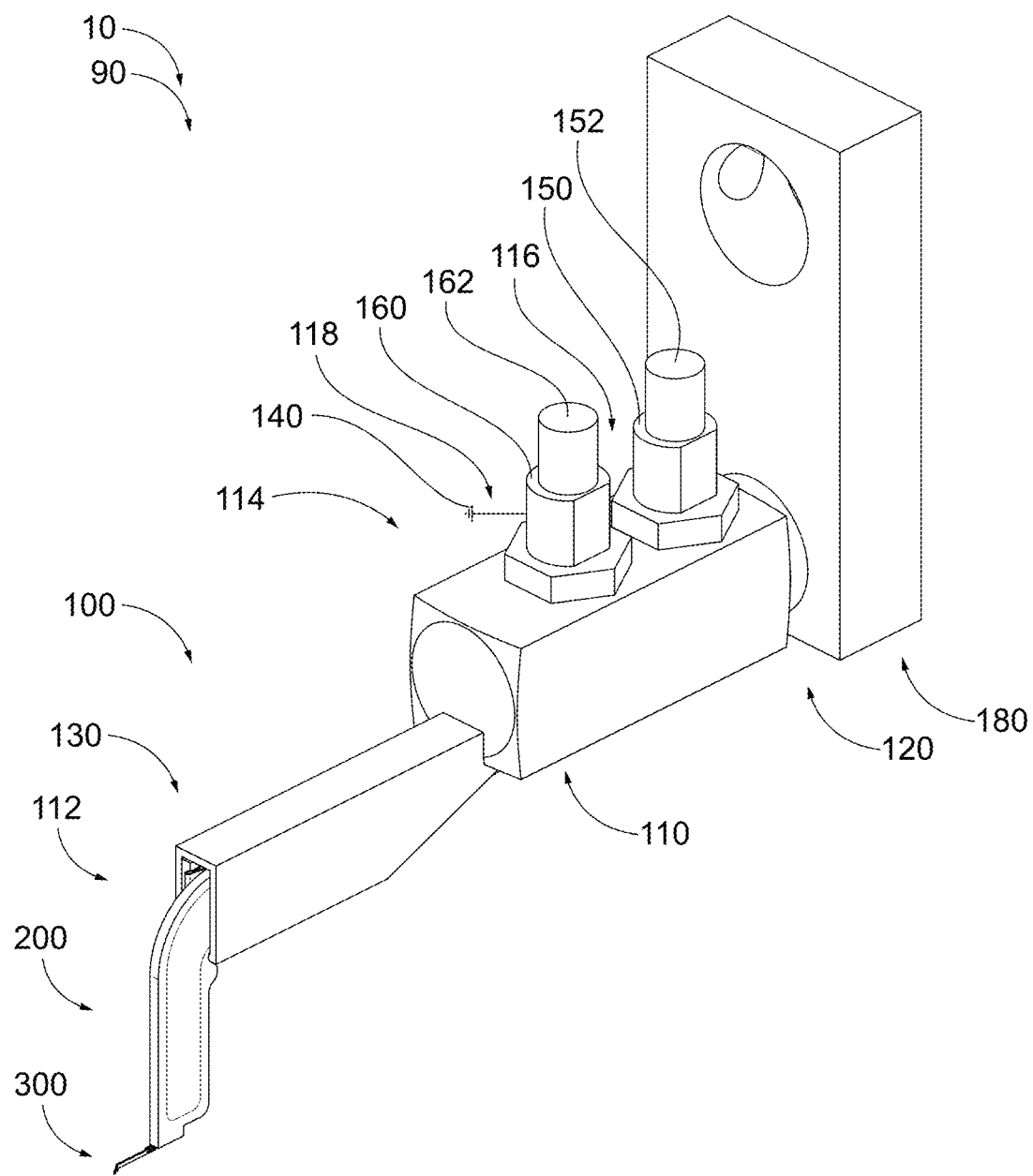
FIG. 17 is an illustration of an example of a blade holder configured to hold a probe blade, according to the present disclosure.

To facilitate formation of the Kelvin connection with the DUT, first probe tip 351 and second probe tip 352 may be configured, oriented, and/or relatively positioned to electrically contact a single contact pad of the DUT. With this in mind, a distance 260 between the first probe tip and the second probe tip, which is illustrated in FIGS. 1, 6, and 13, may be less than, or may be less than a threshold fraction of, a corresponding width 36 of the single contact pad, as illustrated in FIG. 1. Examples of the threshold fraction include 80%, 70%, 60%, 50%, 40%, or 30%.

In general, blade thickness 214 of probe blade 200 may be greater than the corresponding width of the single contact pad. With this in mind, probe blade 200 may be configured to permit and/or to facilitate distance 260 between the first probe tip and the second probe tip being less than blade thickness 214. As an example, and as illustrated in FIGS. 6 and 13, first probe 301 and/or second probe 302 may be oriented at a probe extension angle 390 with respect to probe blade 200 and/or with respect to first blade side 211 and/or second blade side 212 thereof. Stated differently, the first probe and the second probe may taper toward one another as they extend away from the probe blade. Examples of the probe extension angle include at least 0 degrees, at least 1 degree, at least 2 degrees, at least 4 degrees, at least 6 degrees, at least 8 degrees, at least 10 degrees, at least 12 degrees, at least 14 degrees, at most 20 degrees, at most 18 degrees, at most 16 degrees, at most 14 degrees, at most 12 degrees, at most 10 degrees, at most 8 degrees, at most 6 degrees, or at most 4 degrees.

In general, it may not be feasible, or at least practical, to attach first probe 301 and second probe 302 to corresponding sides (e.g., first blade side 211 and second blade side 212, respectively) of probe blade 200 and also to orient the first probe and the second probe such that they taper toward one another and/or define probe extension angle 390 with respect to the probe blade. With this in mind, and as perhaps best illustrated in FIGS. 6, 9, and 12, probes 300, such as first probe 301 and/or second probe 302, may be operatively attached to an attachment surface 270 of probe blade 200 that extends between first blade side 211 and second blade side 212. Stated differently, first probe 301 and second probe 302 may be operatively attached to the same surface of the probe blade, namely, attachment surface 270.

To facilitate such a configuration, and as illustrated, first electrically conductive trace 241 may include a first trace extension region 271 that extends and/or is defined on attachment surface 270. Similarly, second electrically conductive trace 242 may include a second trace extension region that extends and/or is defined on attachment surface 270. First trace extension region 271 and second trace extension region 272 both may extend at least partially within a region of attachment surface 270 that is directly between first blade side 211 and second blade side 212. First probe 301 may be operatively and/or electrically attached to first trace extension region 271 and/or may be in electrical communication with first electrically conductive trace 241 via the first trace extension region. Similarly, second probe 302 may be operatively and/or electrically attached to second trace extension region 272 and/or may be in electrical communication with second electrically conductive trace 242 via the second trace extension region.

Figure 9:
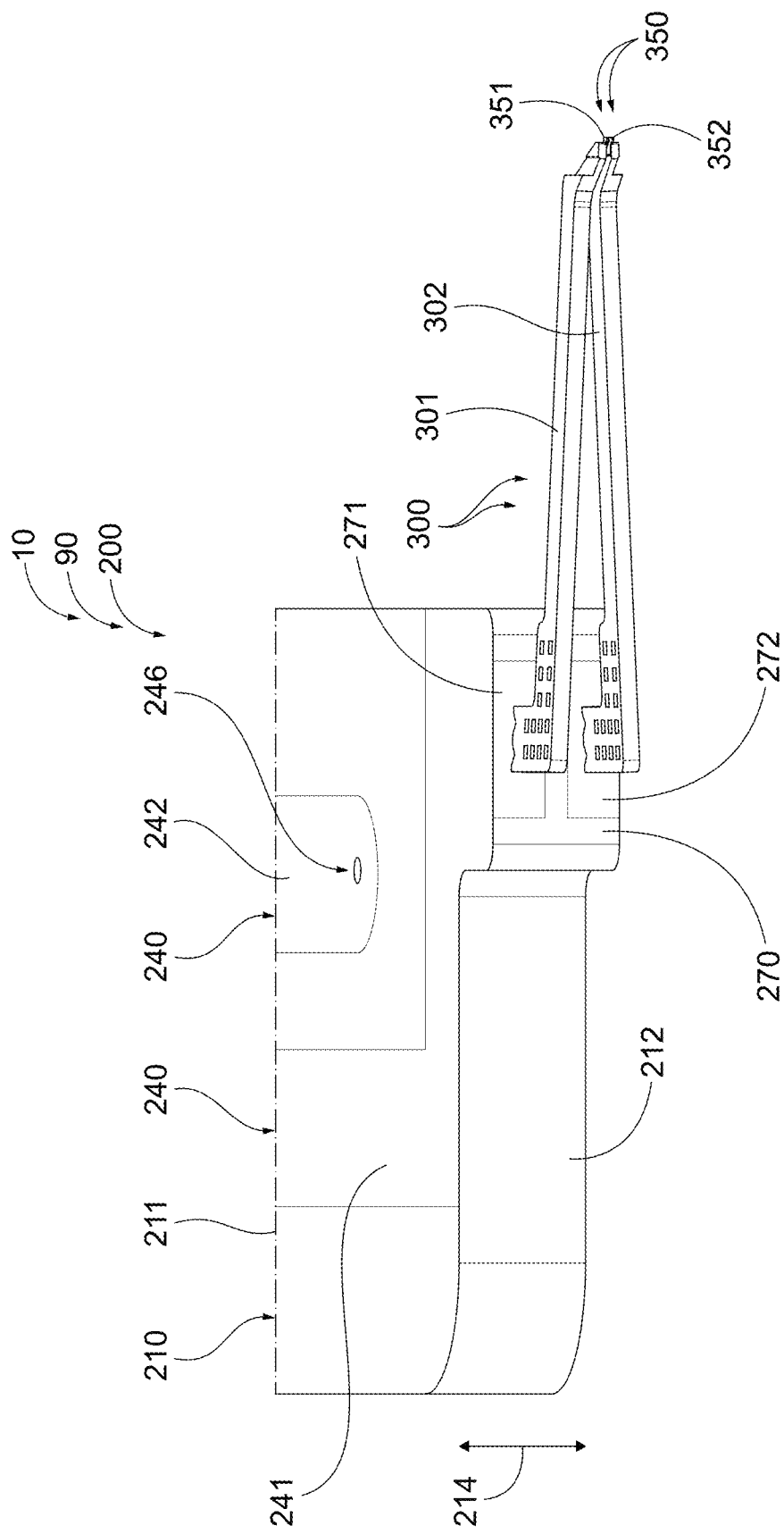
FIG. 9 is another illustration of a region of the probe blade of FIGS. 7-8.
Figure 10:
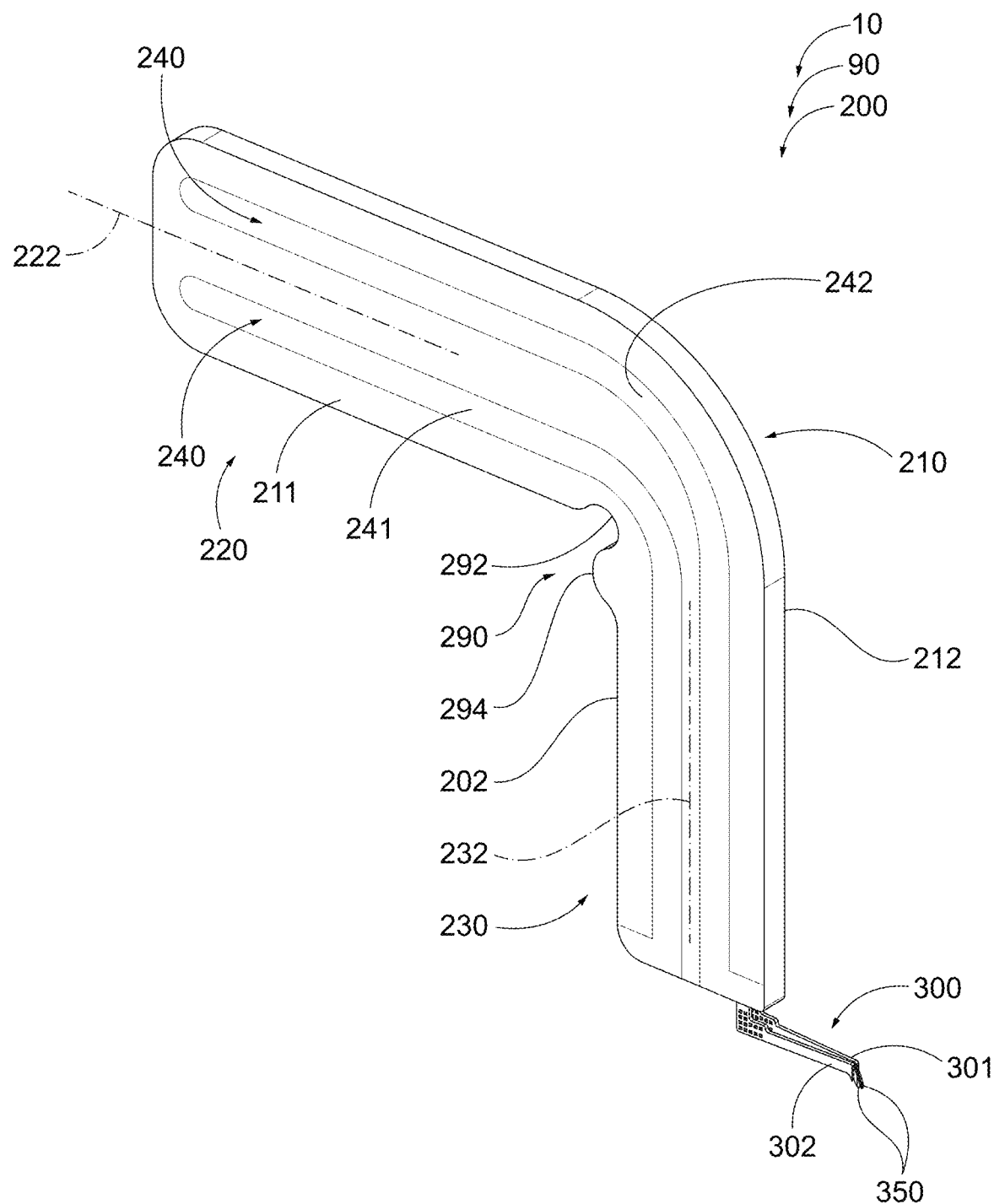
FIG. 10 is an illustration of another example of a probe blade that includes two probes and is configured to form the Kelvin connection with the DUT, according to the present disclosure.
Figure 11:
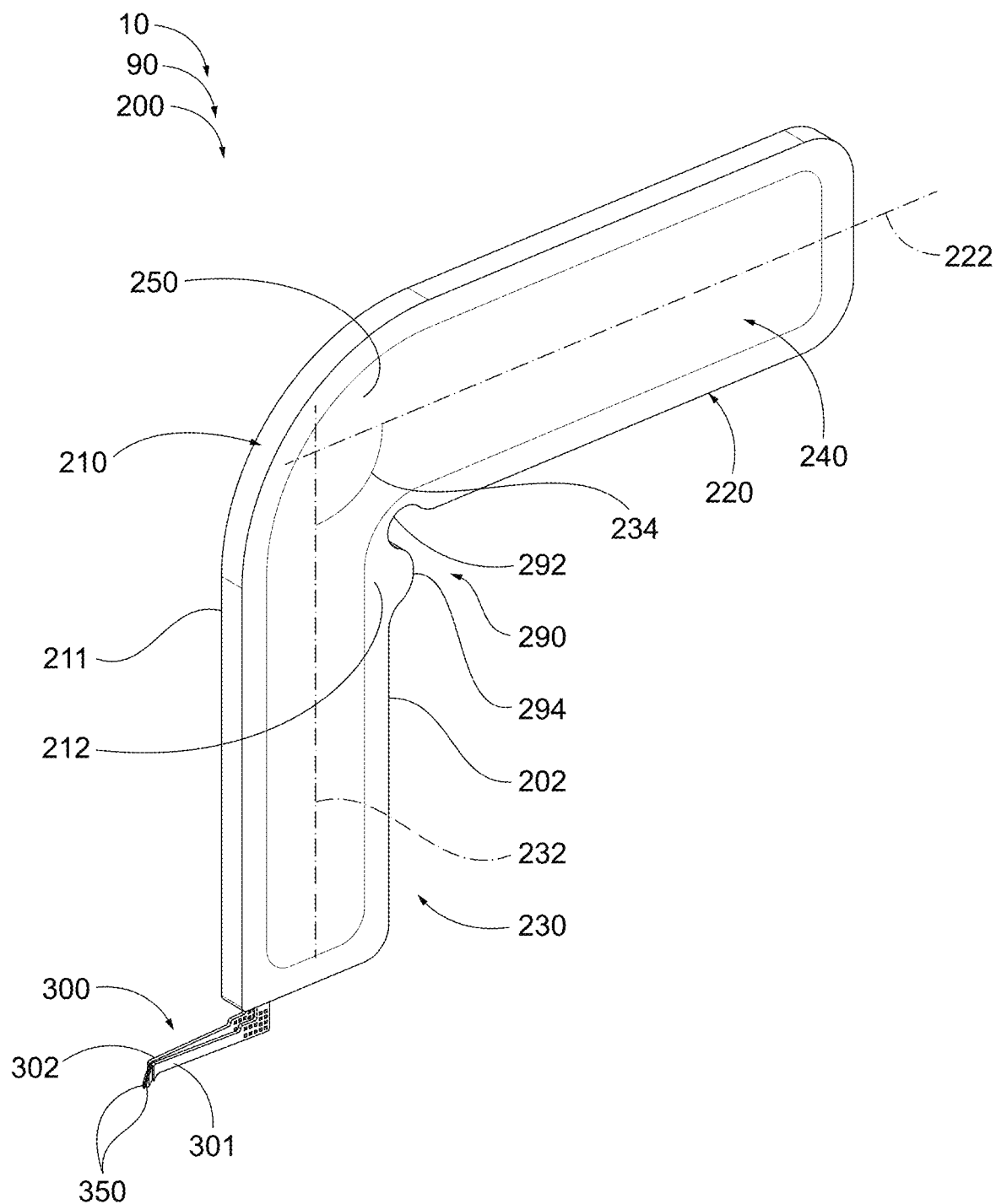
FIG. 11 is another illustration of the probe blade of FIG. 10.
Figure 12:
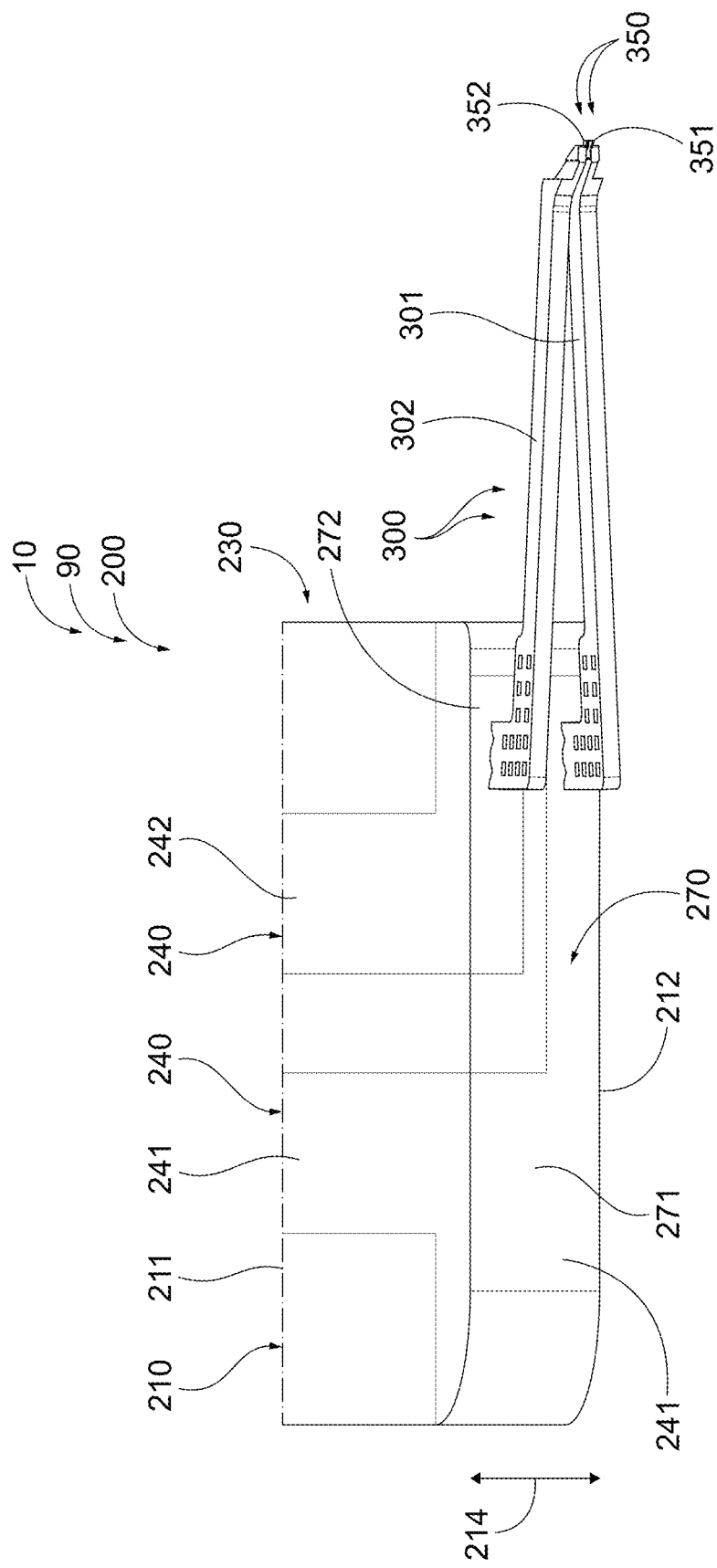
FIG. 12 is another illustration of a region of the probe blade of FIGS. 10-11.

First trace extension region 271 may extend from and/or be in electrical communication with a remainder of first electrically conductive trace 241 in any suitable manner. As an example, and as illustrated in FIGS. 6 and 9, first electrically conductive trace 241 may extend along, or only along, first blade side 211 and may wrap and/or extend around and/or over an edge of the first blade side and onto attachment surface 270 to form and/or define the first trace extension region. Similarly, second trace extension region 272 may extend from and/or be in electrical communication with a remainder of second electrically conductive trace 242 in any suitable manner. As an example, and as illustrated in FIGS. 6 and 12, second electrically conductive trace 242 may extend along, or only along, first blade side 211 and may wrap and/or extend around and/or over the edge of the first blade side and onto attachment surface 270 to form and/or define the second trace extension region. As another example, and as illustrated in FIGS. 6 and 9, second electrically conductive trace 242 may extend partially along first blade side 211 to a via 246, which may extend through probe blade 200 and/or between first blade side 211 and second blade side 212. The second electrically conductive trace then may extend partially along second blade side 212 and may wrap and/or extend around and/or over an edge of the second blade side and onto attachment surface 270 to form and/or define the second trace extension region.

Probes 300, including first probe 301 and second probe 302, may be handed and/or sided. Stated differently, a given probe 300 may be configured to be positioned on and/or attached to a given side of probe blades 200. As an example, and with reference to FIGS. 6 and 13, first probe 301 may be fabricated and/or constructed such that first probe tip 351 is positioned on a side of the first probe that faces toward second probe 302 and/or relatively proximate the side of the first probe that faces toward the second probe when compared to the side of the first probe that faces away from the second probe. Stated differently, the first probe tip may be closer to the side of the first probe that faces toward the second probe when compared to the side of the first probe that faces away from the second probe. Similarly, and as also illustrated in FIGS. 6 and 13, second probe 302 may be fabricated and/or constructed such that second probe tip 352 is positioned on a side of the second probe that faces toward first probe 301 and/or is relatively proximate the side of the second probe that faces toward the first probe when compared to the side of the second probe that faces away from the first probe. Stated differently, the second probe tip may be closer to the side of the second probe that faces toward the first probe when compared to the side of the first probe that faces away from the second probe. Such a configuration may permit and/or facilitate relatively smaller and/or shorter distances 260 between probe tip 351 and 352 than would be feasible if the first probe and the second probe were identical in construction.

As perhaps best illustrated in FIGS. 4-5, 7-9, and 14-16, and in some examples, probe blades 200 may include and/or may define a clearance region 280. Clearance region 280 may extend away from attachment surface 270 and/or from probes 300 and may be shaped, sized, and/or positioned to provide additional clearance and/or space for probes 300 to interact with and/or to contact the contact pad of the DUT. As an example, the presence of clearance region 280 may permit relatively larger and/or more rigid probe blades 200 to be utilized while, at the same time, decreasing a potential for contact between the probe blade and the DUT when probe tips 350 are brought into contact with the DUT.

In some examples, probe blades 200 may be configured to permit and/or facilitate a Kelvin, or a quasi-Kelvin, electrical connection between probe system 10 and the DUT. In such a configuration, as collectively illustrated by FIGS. 4, 14, and 16, and as indicated at 244, a probe-proximate end of second electrically conductive trace 242 may be in electrical communication with, or shorted to, a probe-proximate end of first electrically conductive trace 241. Stated differently, first electrically conductive trace 241 and second electrically conductive trace 242 may be shorted together within probe-mounting region 230. However, the first electrically conductive trace and the second electrically conductive trace may be spaced apart and/or electrically isolated from one another along a remainder of a length of the first electrically conductive trace. Such a configuration may permit and/or facilitate formation of the quasi-Kelvin connection proximate, such as within a few millimeters of, a single probe tip 350 that is in electrical communication with both the first electrically conductive trace and the second electrically conductive trace. This may increase an accuracy of quasi-Kelvin measurements that are made utilizing probe system 10 when compared to conventional probe systems within which a corresponding short between corresponding conductors that carry force and sense signals is relatively more distal from the corresponding probe tip.

Figure 4:
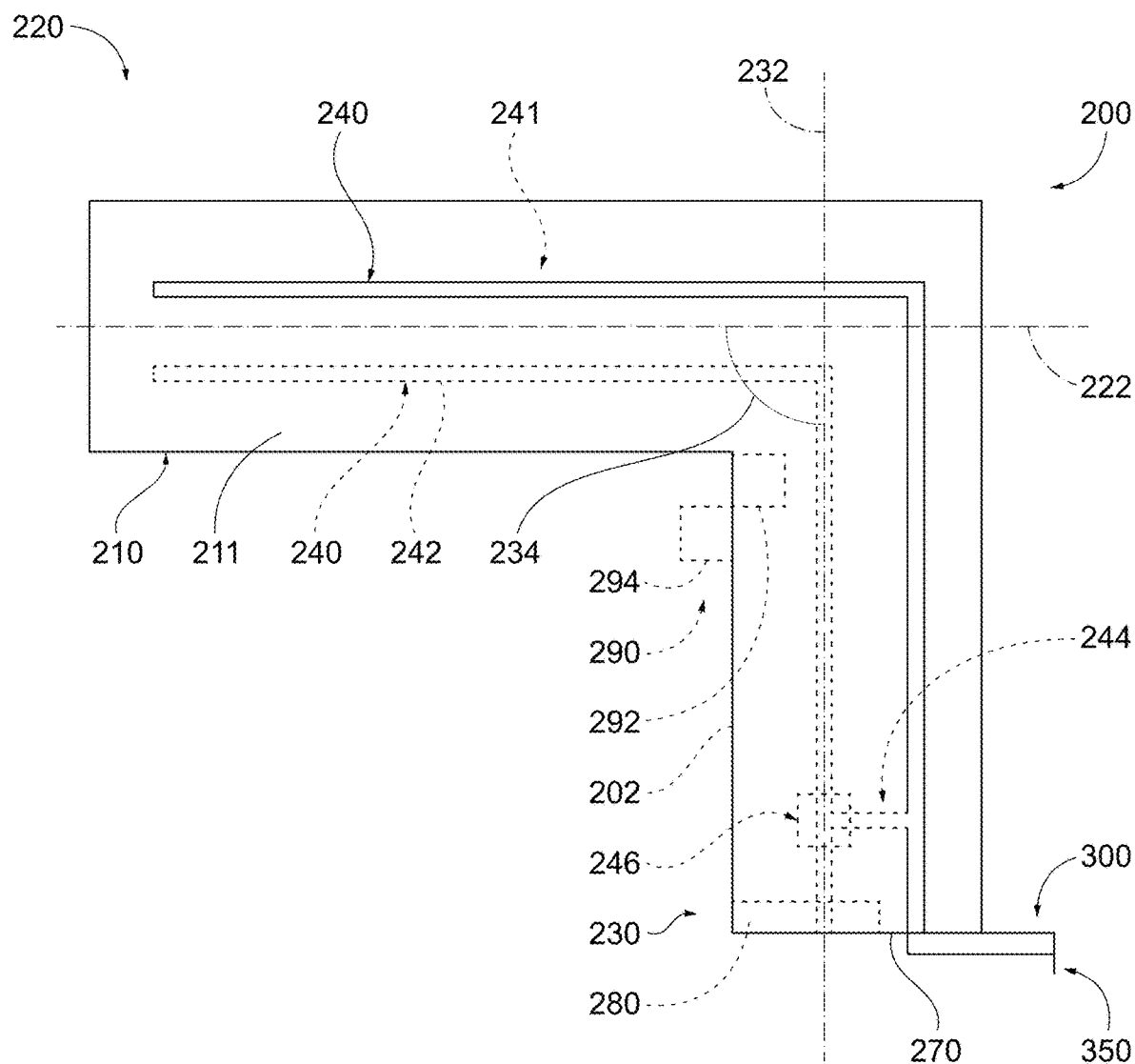
FIG. 4 is a schematic illustration of examples of a probe blade that includes two probes, according to the present disclosure.
Figure 5:
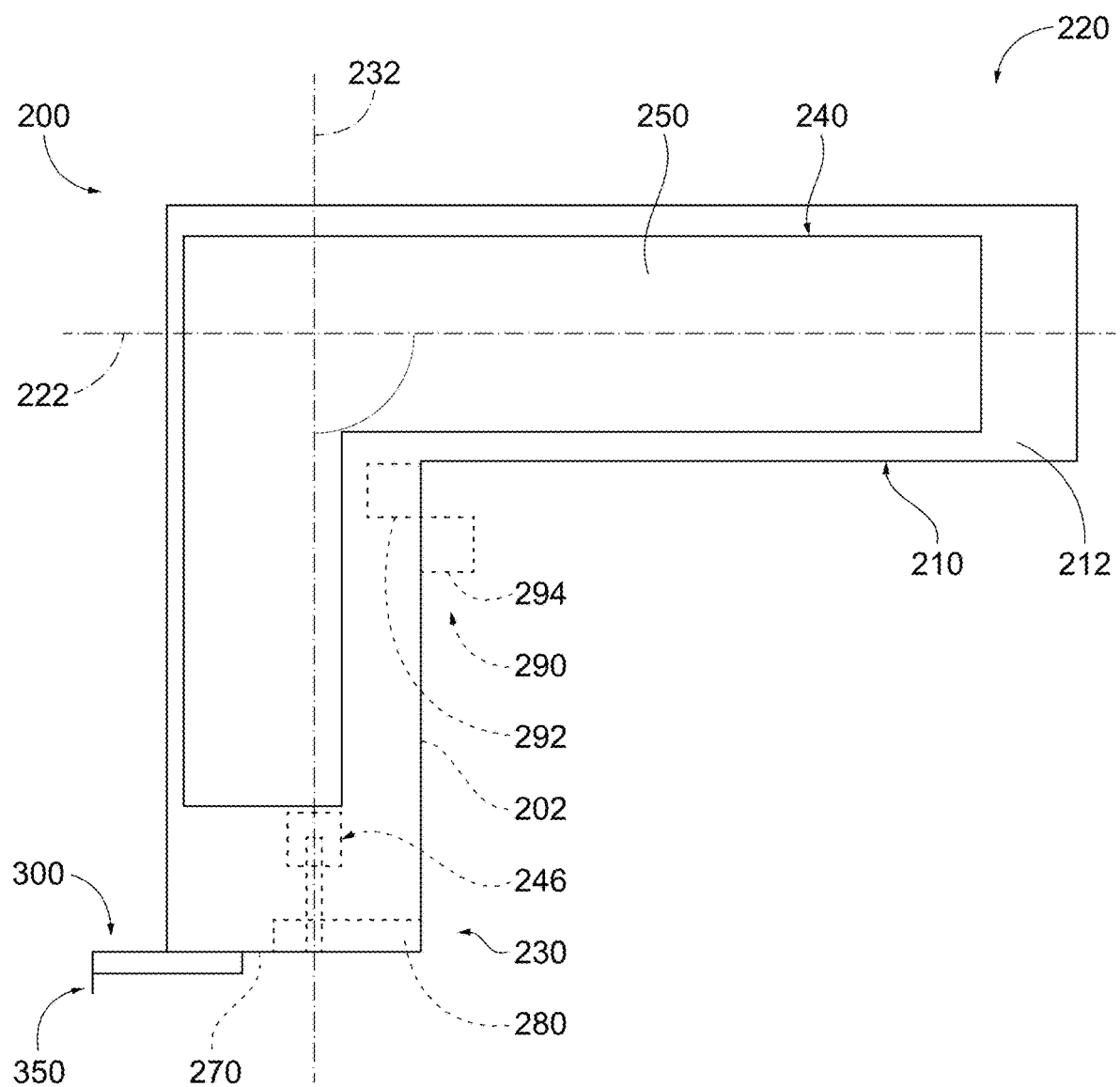
FIG. 5 is another illustration of the probe blade of FIG. 4.
Figure 18:
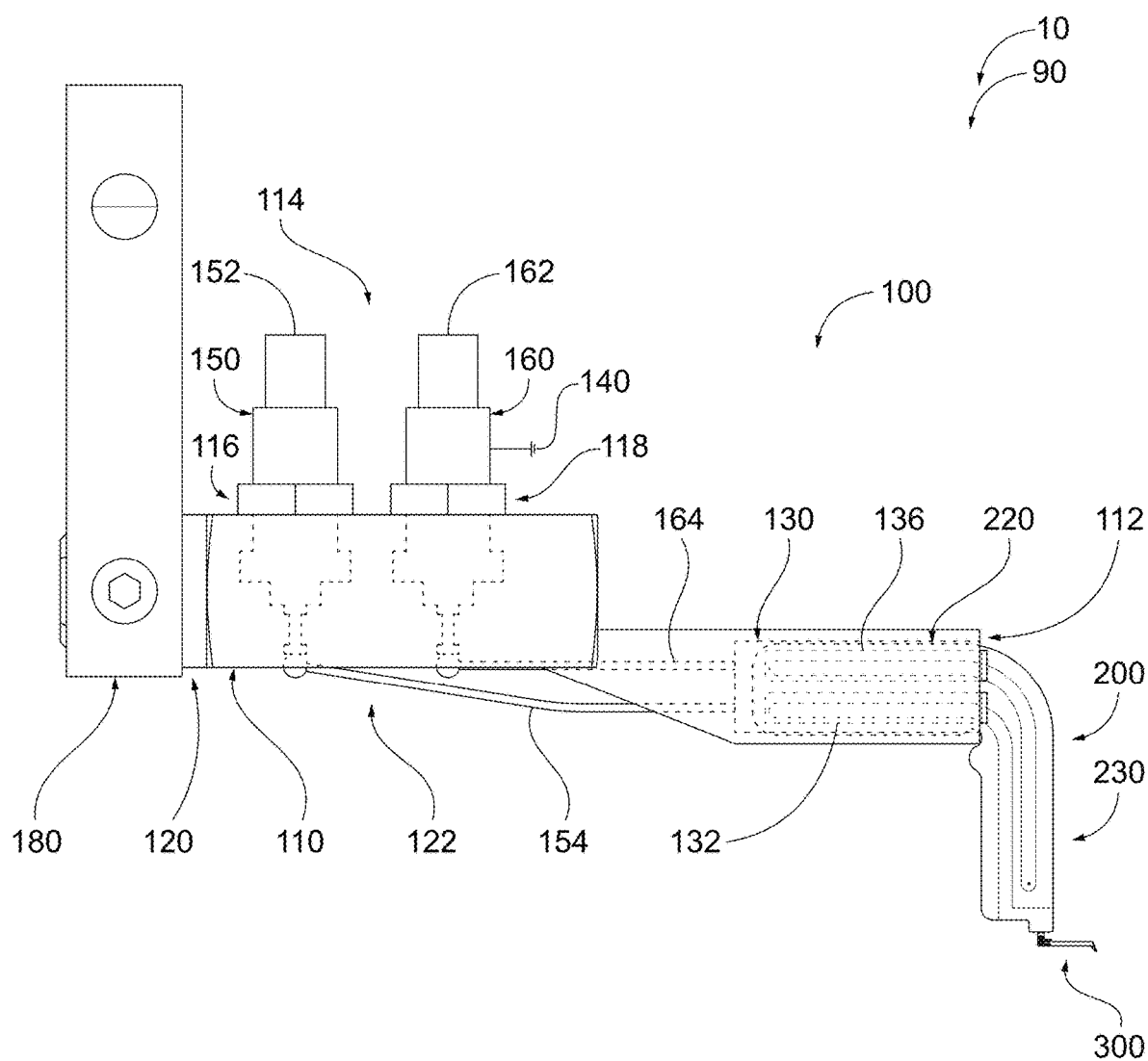
FIG. 18 is another illustration of the blade holder of FIG. 17.
Figure 19:
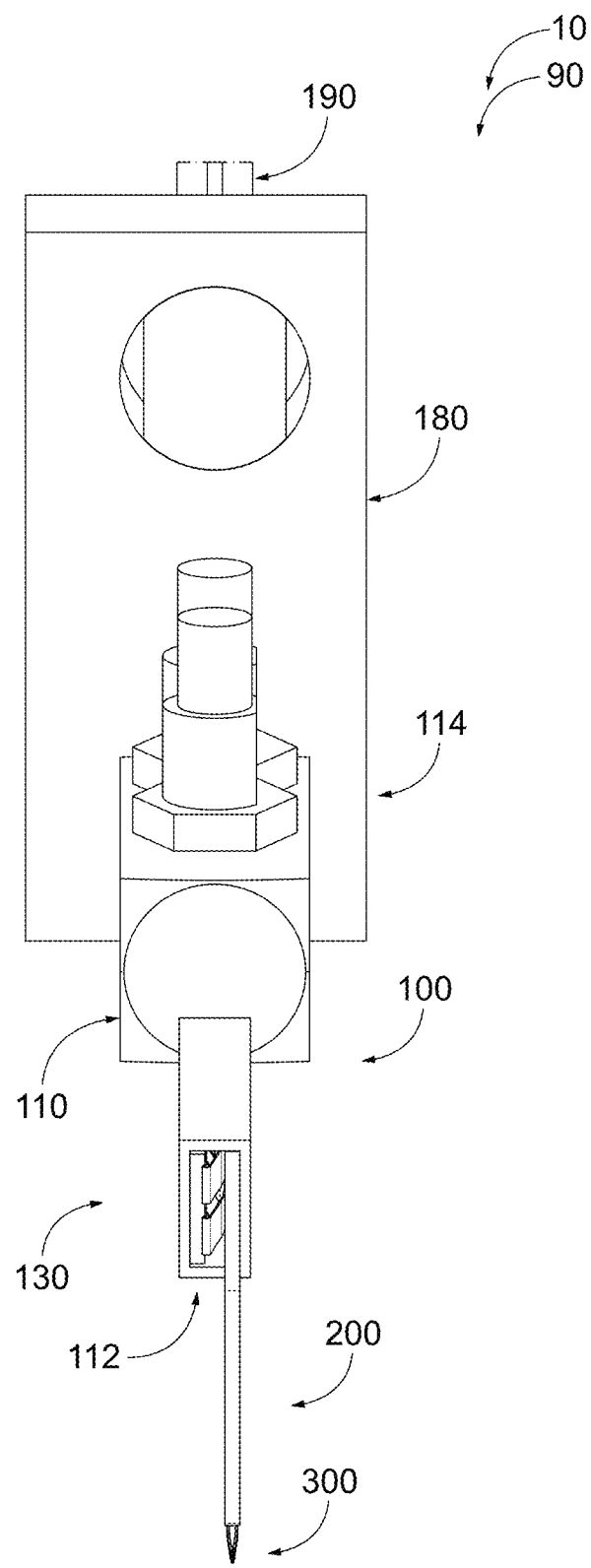
FIG. 19 is another illustration of the blade holder of FIGS. 17-18.
Figure 20:
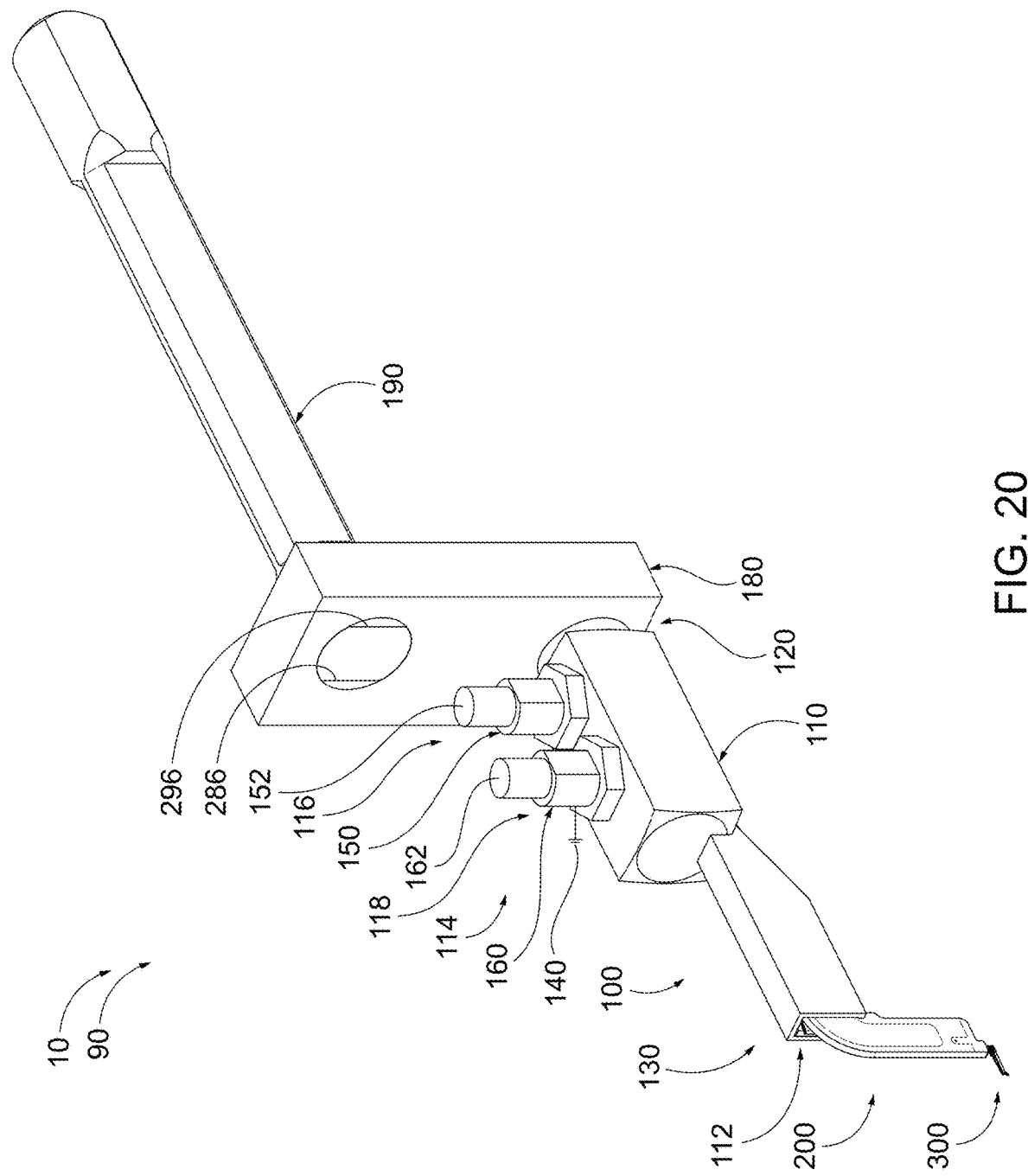
FIG. 20 is another illustration of the blade holder of FIGS. 17-19.
Figure 21:
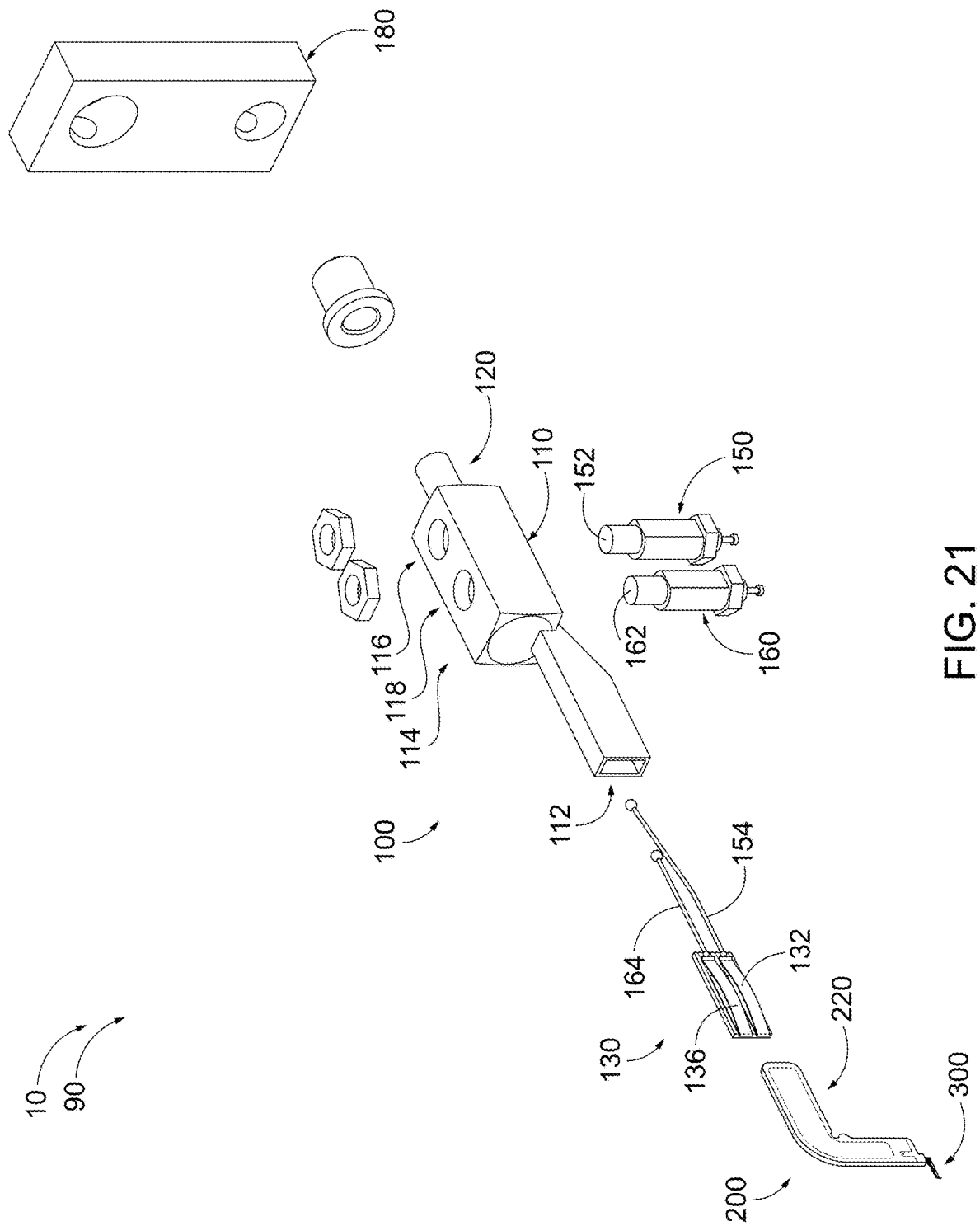
FIG. 21 is another illustration of the blade holder of FIGS. 17-20.
Figure 22:
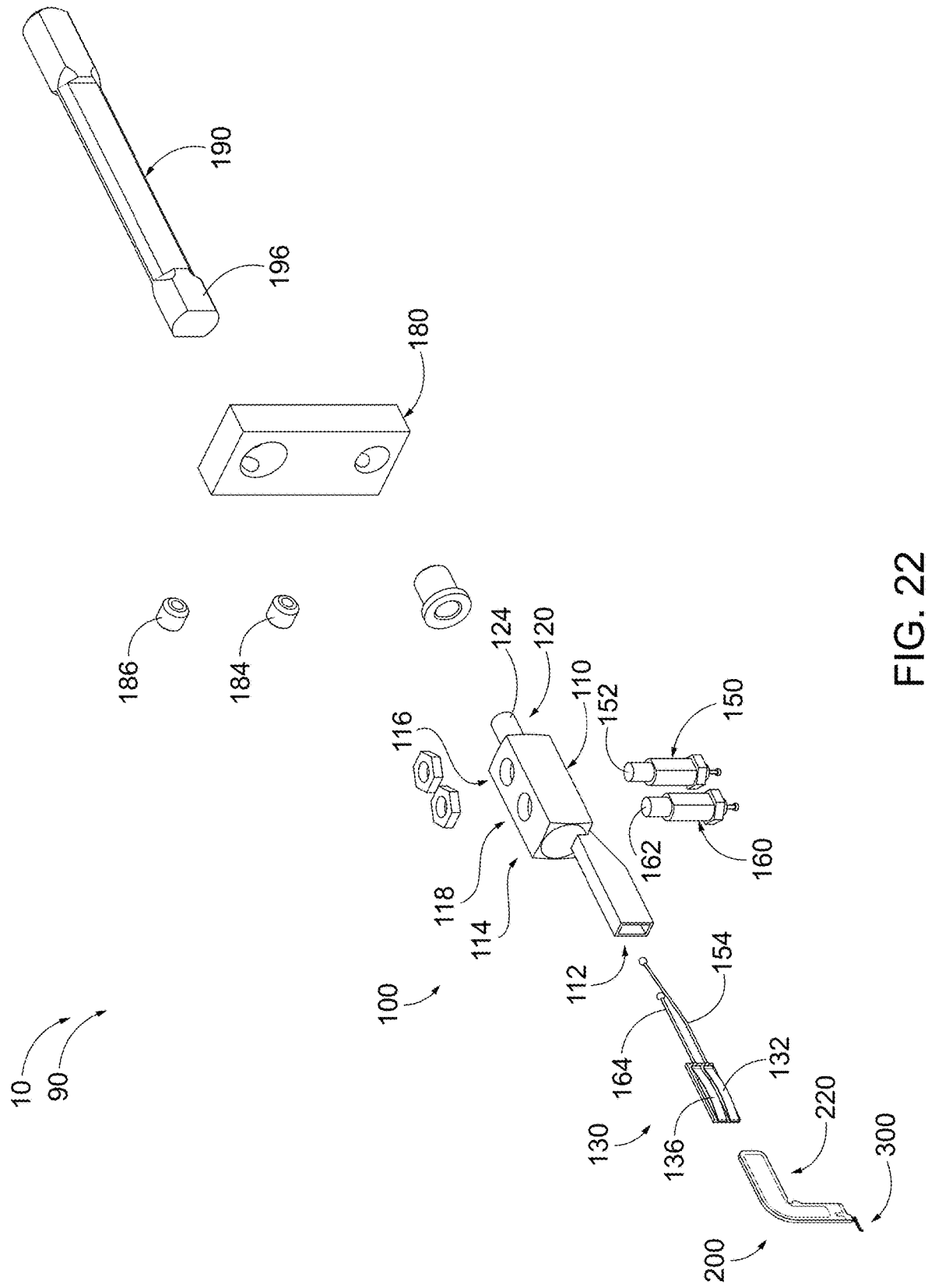
FIG. 22 is another illustration of the blade holder of FIGS. 17-20.
Figure 23:
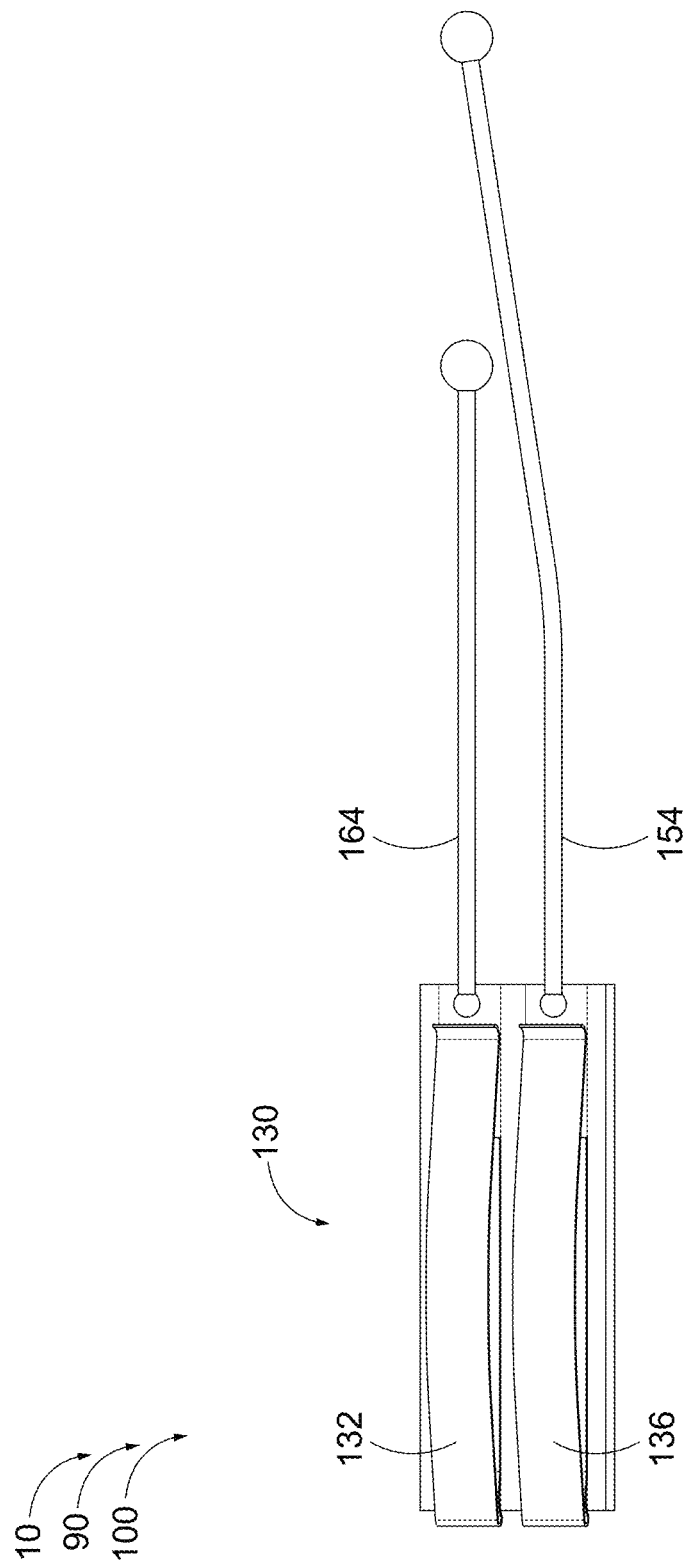
FIG. 23 is an example of a blade-contacting structure that may be included in a blade holder, according to the present disclosure.
Figure 24:
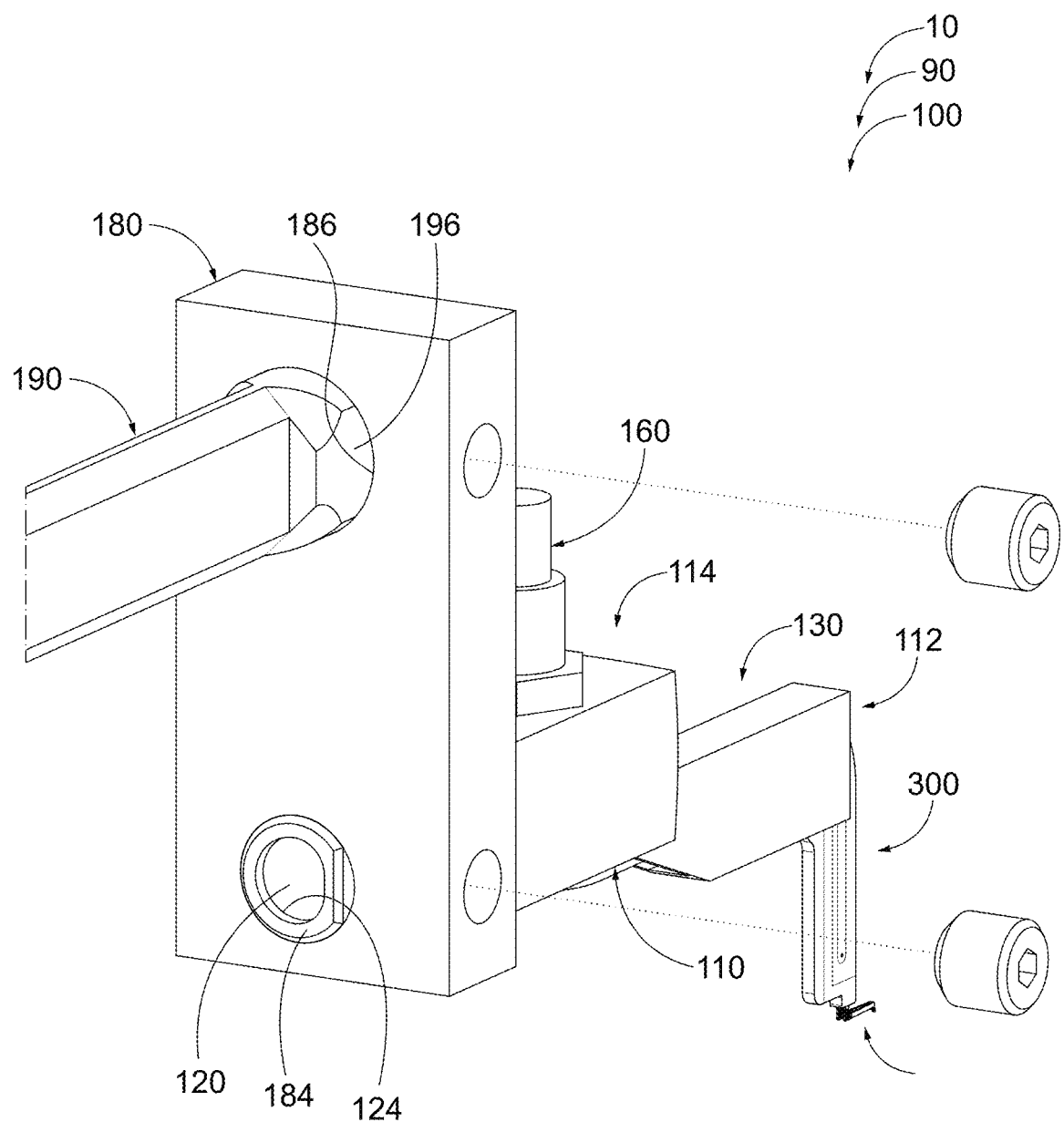
FIG. 24 is another illustration of the blade holder of FIGS. 17-23.
Figure 25:
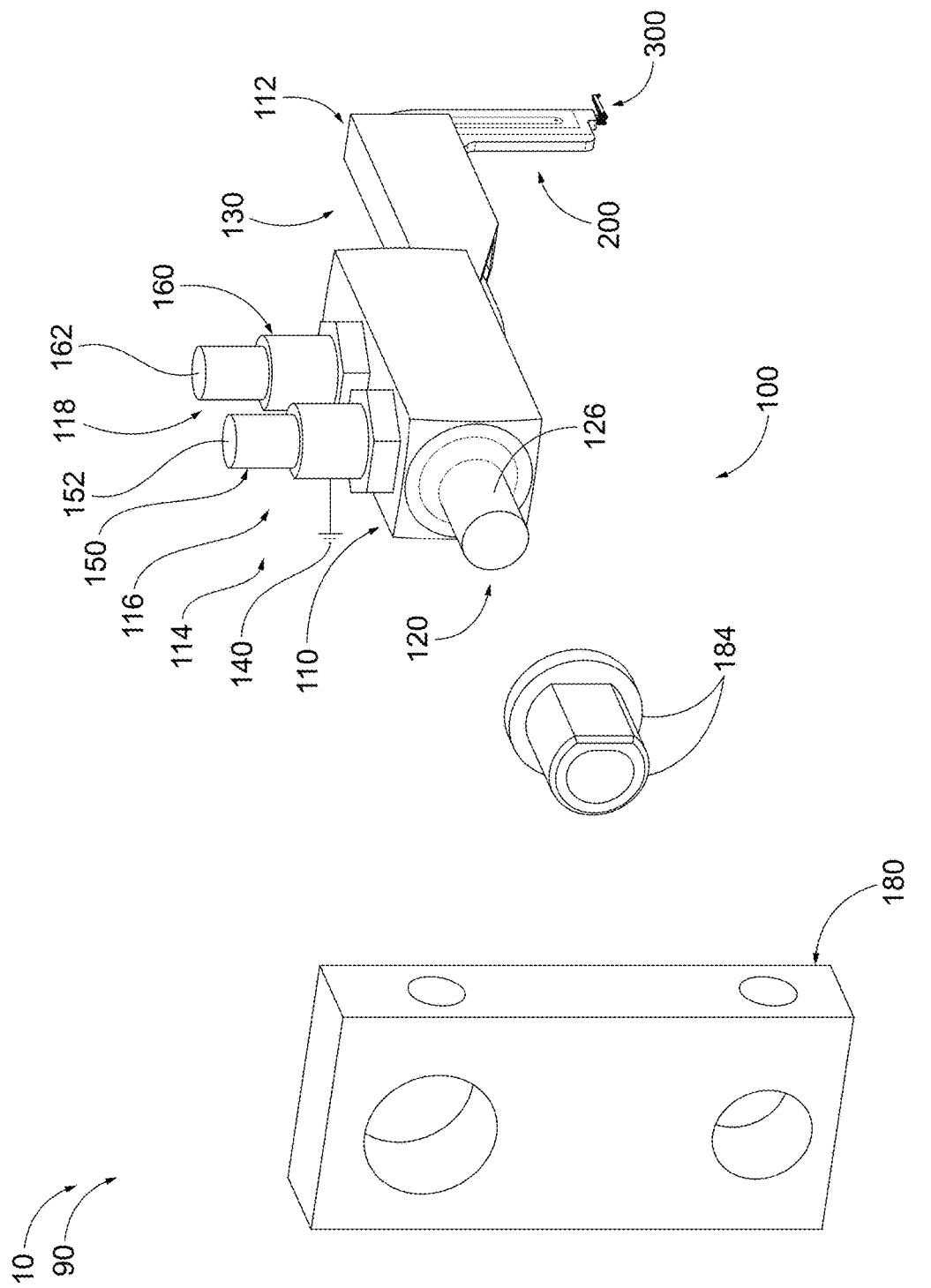
FIG. 25 is another illustration of the blade holder of FIGS. 17-24.
Figure 26:
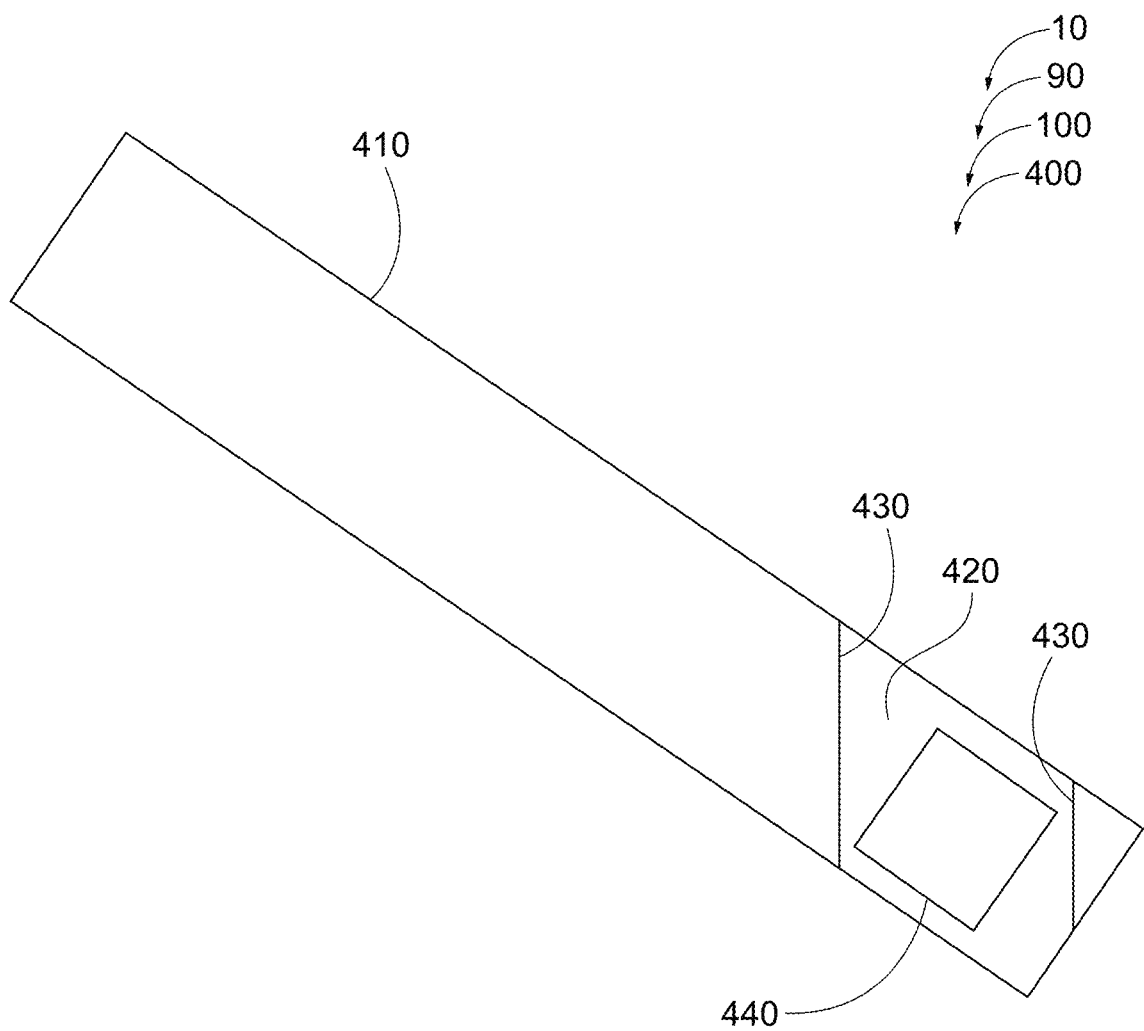
FIG. 26 is a schematic illustration of examples of a tool configured to facilitate probe blade insertion and/or removal, according to the present disclosure.

As illustrated in dashed lines in FIGS. 4-5 and in solid lines in FIGS. 7-8, 10-11, and 14-15, and in some examples, probe blades 200 may include an alignment structure 290. Alignment structure 290 may be adapted, configured, sized, shaped, and/or constructed to interact and/or to engage with blade holders 100, such as to permit and/or facilitate improved, more consistent, and/or more reproducible alignment between probe blades 200 and blade holders 100 when the probe blades are separably and operatively attached to the blade holders. Examples of alignment structure 290 include a notch 292, which is defined and/or extends into and/or within the probe blade, or an edge region 202 of the probe blade. Another example of alignment structure 290 includes a protrusion 294, which may project and/or extend from the probe blade, or the edge region of the probe blade. Edge region 202 may include a region of the probe blade that extends between first blade side 211 and second blade side 212. Notch 292 may be shaped to receive a region of blade holder 100 and/or protrusion 294 may be configured to extend around the region of the blade holder, such as to precisely locate the probe blade with respect to the blade holder and/or to define a specific and/or a single relative orientation between the probe blade and the blade holder when the probe blade is separably and operatively attached to the blade holder. An example of this is illustrated in FIG. 18.

FIGS. 17-25 are illustrations of examples of blade holders 100 according to the present disclosure. Blade holders 100 may include any suitable structure that may be adapted, configured, designed, and/or constructed to separably and operably attach probe blades 200 to probe system 10 and/or to form one or more electrical connections with the probe blades. As collectively illustrated by FIGS. 17-25, blade holders 100 may include an electrically conductive holder housing 110, a blade-contacting structure 130, a ground electrical connection 140, a force electrical connection 152, a force conductor 154, a sense electrical connection 162, and/or a sense conductor 164.

Blade holders 100, examples of which are illustrated in FIGS. 17-25, may include and/or be more detailed illustrations of blade holders 100 that are illustrated in FIG. 1. With this in mind, any of the structures, functions, and/or features that are disclosed herein with reference to blade holders 100 of FIGS. 17-25 may be included in and/or utilized with probe blades 200 of FIGS. 1, 4-22, 24-25, and/or 30 without departing from the scope of the present disclosure. Similarly, any of the structures, functions and/or features that are disclosed herein with reference to probe blades 200 of FIGS. 1, 4-22, 24-25, and/or 30 may be included in and/or utilized with probe blades 200 of FIGS. 4-16 without departing from the scope of the present disclosure.

Electrically conductive holder housing 110 may be formed and/or defined from any suitable electrically conductive material and/or materials. As an example, electrically conductive holder housing 110 may include and/or be a metallic electrically conductive holder housing 110. In some examples, the electrically conductive holder housing additionally or alternatively may include and/or be a unitary electrically conductive holder housing.

Electrically conductive holder housing 110 defines a blade-receiving region 112, which is configured to receive blade-mounting region 220 of probe blade 200. Blade-receiving region 112 may be shaped and/or sized to receive the blade-mounting region of the probe blade. As an example, a shape of the blade-receiving region may correspond to a shape of the blade-mounting region. In some examples, the blade-receiving region may include and/or define a rectangular, or an at least partially rectangular, transverse cross-sectional shape. In some examples, and as discussed, probe blades 200 may include and/or define one or more alignment structures 290, which may be adapted, configured, shaped, and/or sized to engage and/or to interact with blade holder 100 when the probe blade is positioned within blade-receiving region 112. As an example, and as illustrated in FIG. 18, a bottom surface of a portion of electrically conductive holder housing 110 that defines blade-receiving region 112 may be received within notch 292 of alignment structure 290. As another example, and with continued reference to FIG. 18, protrusion 294 of alignment structure 290 may bear against and/or contact an outer surface and/or edge of the portion of the electrically conductive holder housing that defines the blade-receiving region. Such a configuration may cause probe blade 200 to define a predetermined, an established, and/or a repeatable relative orientation with respect to the blade holder, thereby decreasing variability in the orientation of the probe blade with respect to the blade holder and/or decreasing a potential for motion of the probe blade relative to the blade holder when probes 300 are brought into contact with the DUT. Additionally or alternatively, contact between protrusion 294 and the outer surface of the portion of the electrically conductive holder housing may resist upward motion (in the configuration that is illustrated in FIG. 18) of probe blade 200 with respect to blade holder 100 when probes 300 are brought into contact with the DUT.

Electrically conductive holder housing 110 also defines an electrical connection region 114, which is configured to receive a plurality of electrical connections. As an example, electrical connection region 114 may include a force connection aperture 116, which may be configured to receive force electrical connection 152. As another example, electrical connection region 114 may include a sense connection aperture 118, which may be configured to receive sense electrical connection 162. Force connection aperture 116 and/or sense connection aperture 118 may extend into an enclosed housing volume 122 of electrically conductive holder housing 110, as illustrated in FIG. 18, and/or may permit at least a portion of force electrical connection 152 and/or sense electrical connection 162 to be positioned within the enclosed housing volume and/or to extend from within the enclosed housing volume to external the electrically conductive holder housing.

Electrically conductive holder housing 110 also defines a housing-mounting region 120, which is configured to operatively attach the electrically conductive holder housing to, or to a remainder of, probe system 10. An example of housing-mounting region 120 includes a housing-mounting projection that extends from the electrically conductive holder housing. Electrically conductive holder housing 110 also defines at least partially enclosed housing volume 122, which may extend between blade-receiving region 112 and electrical connection region 114. Enclosed housing volume 122 may be electrically guarded and/or shielded by the electrically conductive holder housing, thereby protecting electrical signals that are conveyed therewithin from electrical interference. Electrically conductive holder housing 110 may at least partially, or even completely, enclose housing volume 122 on at least three, at least four, at least five, or at least six sides.

Blade-contacting structure 130 is positioned within blade-receiving region 112 of electrically conductive holder housing 110 and includes a force blade contact 132 and a sense blade contact 136, such as illustrated in the examples shown in FIGS. 18 and 21-23. The force blade contact is configured to electrically contact a force electrically conductive trace, such as one of first electrically conductive trace 241 and second electrically conductive trace 242, of probe blade 200. The sense contact is configured to electrically contact a sense electrically conductive trace, such as the other of the first electrically conductive trace and the second electrically conductive trace.

Blade-contacting structure 130 may be adapted, configured, designed, and/or constructed to retain blade-mounting region 220 of probe blade 200 within blade-receiving region 112. As an example, blade-contacting structure 130 may include and/or be a biased blade-contacting structure, which may be configured to exert a bias force on the probe blade to retain the probe blade within the blade-receiving region. In some examples, force blade contact 132 may include and/or be a resilient force blade contact configured to be deformed to permit the blade-mounting region of the probe blade to be received within the blade-receiving region. Upon deformation, the resilient force blade contact may exert a corresponding restoring force on probe blade 200 and/or on blade-mounting region 220 thereof to retain the blade-mounting region within the blade-receiving region. Additionally or alternatively, and in some examples, sense blade contact 136 may include and/or be a resilient sense blade contact configured to be deformed to permit the blade-mounting region of the probe blade to be received within the blade-receiving region. Upon deformation, the resilient sense blade contact may exert a corresponding restoring force on probe blade 200 and/or on blade-mounting region 220 thereof to retain the blade-mounting region within the blade-receiving region.

As collectively illustrated by FIGS. 4-16, force electrically conductive trace 241 and sense electrically conductive trace 242 may be positioned on first blade side 211 of probe blade 200, and the probe blade also may include electrically conductive guard layer 250, which may be positioned on second blade side 212 of the probe blade. In such a configuration, blade-contacting structure 130 may be configured to urge the electrically conductive guard layer into contact with an internal surface of blade-receiving region 112, which is at least partially defined by electrically conductive holder housing 110, such that the electrically conductive guard layer is in electrical communication with the electrically conductive holder housing.

As discussed, electrical connection region 114 is configured to receive a plurality of electrical connections. The plurality of electrical connections includes ground electrical connection 140, which is in electrical communication with electrically conductive holder housing 110 and/or grounds the electrically conductive holder housing. The plurality of electrical connections also includes force electrical connection 152, which is electrically isolated from the electrically conductive holder housing, and sense electrical connection 162, which is electrically isolated from both the electrically conductive holder housing and the force electrical connection.

In a specific example, force electrical connection 152 may be defined by an inner conductor of a force coaxial connector 150. In such examples, ground electrical connection 140 may be at least partially defined by an outer conductor of the force coaxial connector. Similarly, sense electrical connection 162 may be defined by an inner conductor of a sense coaxial connector 160. In such examples, ground electrical connection 140 may be at least partially defined by an outer conductor of the sense coaxial connector.

Force conductor 154 may extend within enclosed housing volume 122, may be electrically isolated from electrically conductive holder housing 110, and/or may electrically interconnect force electrical connection 152 with force blade contact 132. Similarly, sense conductor 164 may extend within enclosed housing volume 122, may be electrically isolated from electrically conductive holder housing 110, and/or may electrically interconnect sense electrical connection 162 with sense blade contact 136.

In some examples, blade holder 100 may include and/or may be operatively attached to probe system 10 via a blade holder mounting plate 180, which may be operatively attached to housing-mounting region 120 of electrically conductive holder housing 110. This is illustrated in FIGS. 17-22 and 24-25. In some such examples, blade holder mounting plate 180 and housing-mounting region 120 together may be keyed to permit only a single relative orientation therebetween, such as is collectively illustrated by FIGS. 22 and 24-25 and indicated at 124 and 184, respectively.

In some examples, blade holder 100 also may include and/or also may be operatively attached to probe system 10, such as to manipulator 40 thereof, via a probe arm 190. In some such examples, blade holder mounting plate 180 and probe arm 190 together may be keyed to permit only a single relative orientation therebetween, such as is collectively illustrated by FIGS. 20, 22, and 24 and indicated at 186 and 196, respectively. Such a configuration may decrease a potential for rotation of blade holder 100 during operative use of the blade holder to test the DUT and/or may decrease time needed to align the blade holder. Additionally or alternatively, such a configuration may facilitate improved alignment of both the first probe and the second probe with the contact pad of the DUT in examples of probe blades 200 that include two probes 300 that are configured to contact a single contact pad of the DUT.

Probe assemblies 90, according to the present disclosure, may provide distinct benefits over conventional probe assemblies. As an example, the overdrive-to-scrub ratio (i.e., a magnitude of overdrive motion to scrubbing motion of the probe tip on the contact pad) that may be obtained by probe assemblies 90 may be greater than a corresponding overdrive-to-scrub ratio that may be obtained by the conventional probe assemblies. Stated differently, and for a given amount of motion of probe assemblies 90 toward the DUT, after contact between the probe tip and the DUT, and in a direction that is parallel to a surface normal of the DUT, motion of probe tips 350 on the contact pad of the DUT is less than corresponding motion exhibited by conventional probe assemblies. Examples of the overdrive-to-scrub ratio for probe assemblies 90 include at least 6-to-1, at least 8-to-1, at least 10-to-1, at least 12-to-1, or at least 14-to-1. This increase in the overdrive-to-scrub ratio may permit probe assemblies 90 to exhibit greater contact forces with the DUT while maintaining electrical contact with small contact pads and may be a result of a variety of different structures of probe assemblies 90 and/or of combinations of these structures.

As an example, the orientation of probe tips 350 relative to beam region 370 of probes 300, such as is defined by tip projection angle 348, may increase the overdrive-to-scrub ratio when compared to the conventional probe assemblies. As another example, the orientation of probe mount 316 relative to beam region 370, which is generally perpendicular, also may increase the overdrive-to-scrub ratio when compared to the conventional probe assemblies. As another example, the vertical compliance provided by beam region 370 may increase the overdrive-to-scrub ratio when compared to the conventional probe assemblies. As another example, beam region 370 generally is oriented parallel, or at least substantially parallel, to the surface of the DUT when the probe contacts the DUT, which also may increase the overdrive-to-scrub ratio when compared to the conventional probe assemblies.

As another example, and because probe blade 200 is a composite structure within which probes 300 are separately fabricated and subsequently attached to the remainder of the probe blade, the material properties of the probes and of dielectric blade body 210 separately may be selected and/or tailored to provide one or more desired characteristics. As an example, dielectric blade body 210 may be rigid, or at least substantially rigid, and/or may be formed from a rigid, or at least substantially rigid, blade body material, examples of which are disclosed herein. Stated differently, dielectric blade body 210 and/or the blade body material may be more rigid when compared to probes 300. This may permit a majority, nearly all, or at least substantially all flex and/or motion within probe assemblies 90 when the probe assemblies contact the DUT to be constrained to probes 300. As another example, an overall shape of probe blades 200 may resist flex and/or motion thereof. As another example, the materials of the individual components of probe assemblies 90 may be selected to provide a high degree of thermal stability.

FIGS. 26-30 illustrate examples of tools 400 configured to facilitate insertion of probe blades 200 into blade holders 100 and/or removal of the probe blades from the blade holders, according to the present disclosure. As collectively illustrated by FIGS. 26-30, tools 400 include a handle region 410, a blade receptacle 420, bearing surfaces 430, and a blade gripping structure 440. Handle region 410 is adapted, configured, sized, and/or shaped to be gripped by a user of the tool, such as during insertion and/or removal of probe blades 200. Blade receptacle 420 is adapted, configured, sized, and/or shaped to receive at least a region of probe blades 200. Bearing surfaces 430 at least partially define blade receptacle 420 and are adapted, configured, sized, and/or shaped to press against edge region 202 of probe blades 200, as perhaps best illustrated in FIG. 30, during insertion and/or removal of the probe blades from the blade holder utilizing the tool. Blade gripping structure 440 is configured to be selectively actuated by the user to grip probe blades 200, such as via application of a compressive gripping force between first blade side 211 and second blade side 212, during insertion and/or removal of the probe blades from the blade holder utilizing the tool. In the example that is illustrated in FIGS. 27-30, blade gripping structure 440 includes a resilient structure that is gripped and/or squeezed by the user of the tool to cause the blade gripping structure to grip the probe blade; however, other configurations of blade gripping structure 440, including clamps, cams, and/or mechanical actuators, also are within the scope of the present disclosure.

Figure 27:
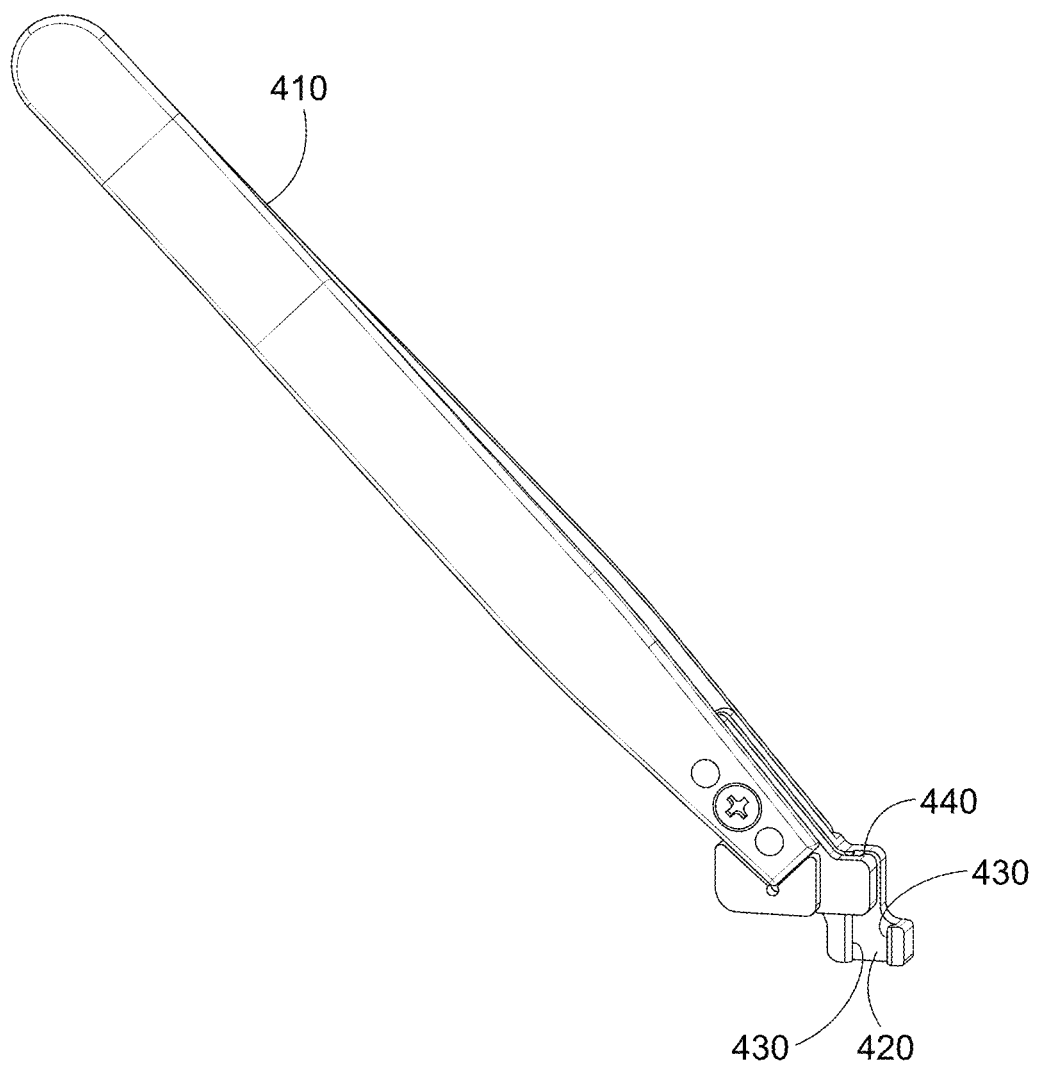
FIG. 27 is a less schematic illustration of an example of a tool configured to facilitate probe blade insertion and/or removal, according to the present disclosure.
Figure 28:
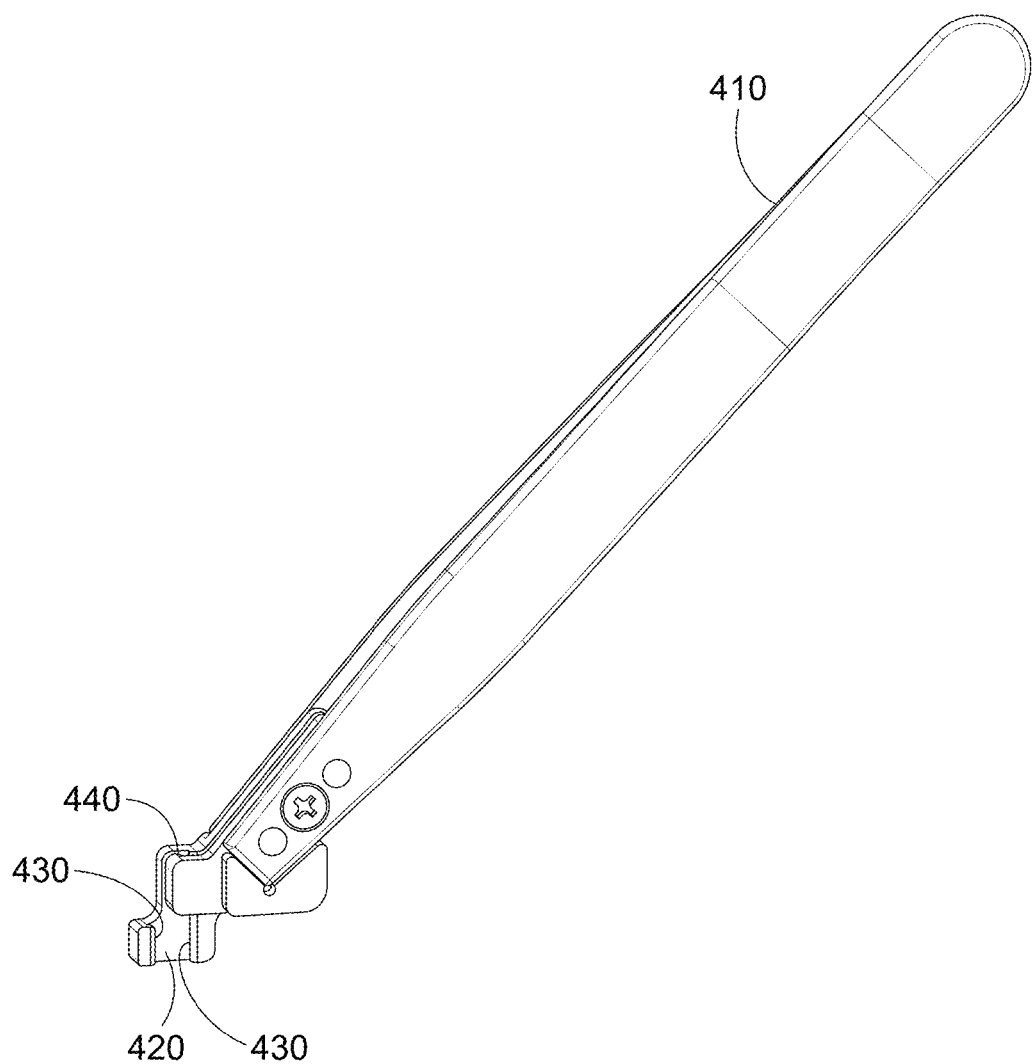
FIG. 28 is a less schematic illustration of an example of a tool configured to facilitate probe blade insertion and/or removal, according to the present disclosure.
Figure 29:
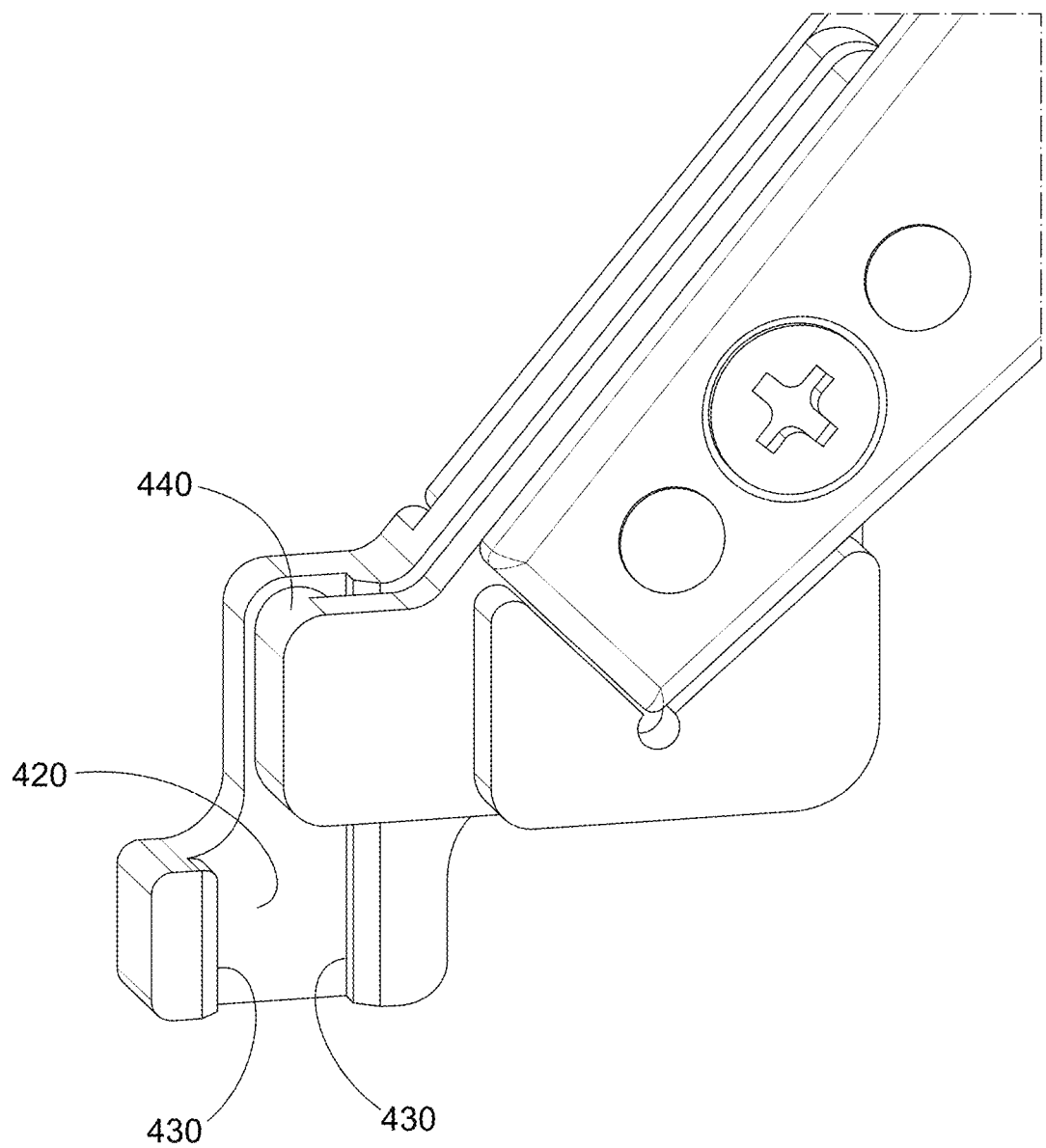
FIG. 29 is an illustration of a portion of the tool of FIG. 28.

FIGS. 27-28 illustrate that tools 400 may be handed, i.e., configured to be grasped or gripped, from a particular side. This may permit and/or facilitate insertion and/or removal of probe blades 200 that are more readily accessed from the left side (e.g., utilizing tool 400 that is illustrated in FIG. 27 and may be referred to herein as a left-handed tool) or from the right side (e.g., utilizing tool 400 that is illustrated in FIG. 28 and may be referred to herein as a right-handed tool).

Figure 30:
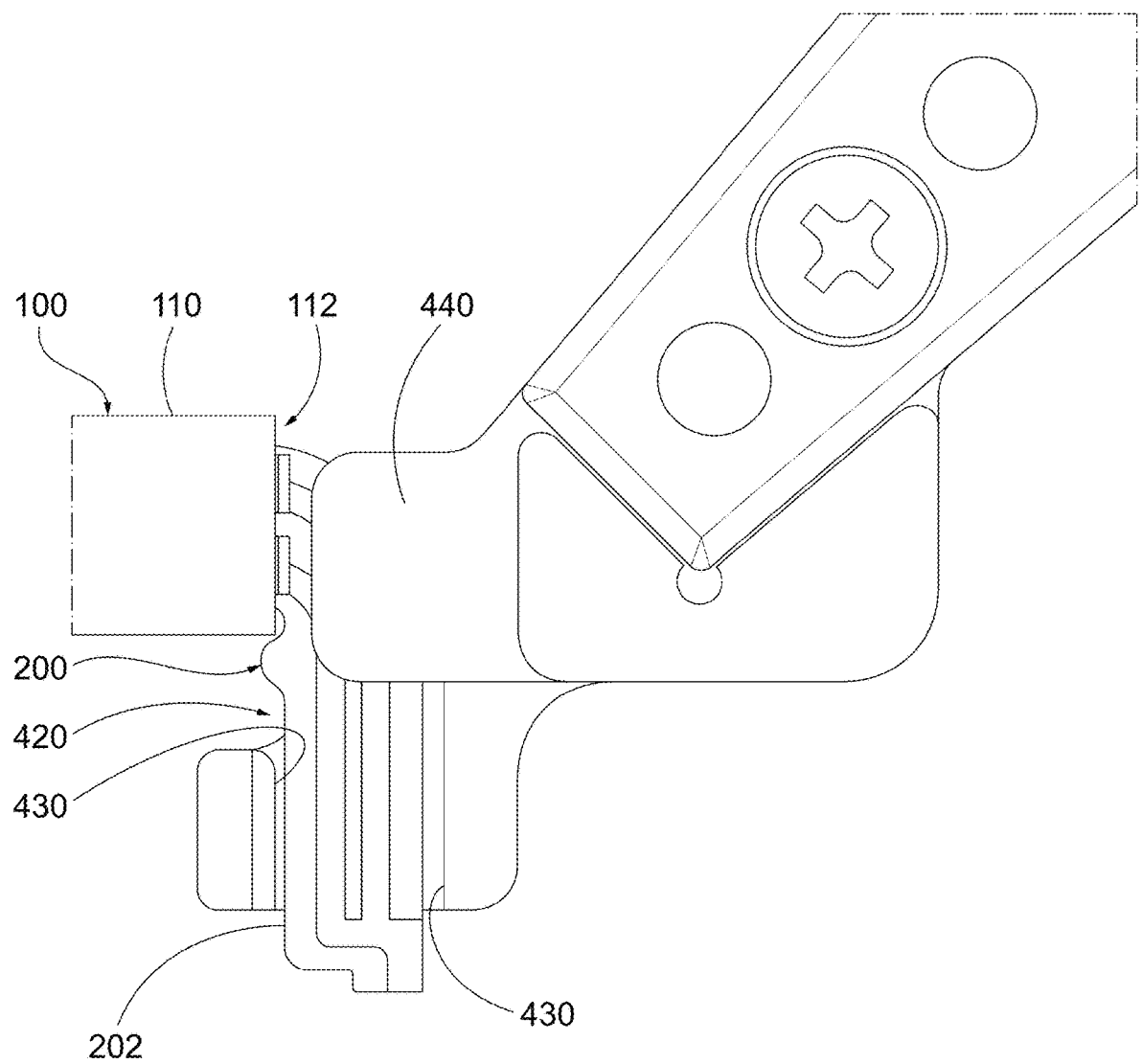
FIG. 30 is an illustration of a portion of the tool of FIG. 28 gripping a probe blade.

During operative use of tools 400 to insert and/or remove probe blades 200 from blade holders 100, and with reference to FIG. 30, probe blade 200 may be positioned within blade receptacle 420 and gripped by blade gripping structure 440. Then, probe blade 200 may be inserted into blade-receiving region 112 of blade holder 100, such as via motion of a corresponding blade-mounting region of the blade into the blade receptacle. During such insertion, bearing surface 430 that is relatively proximate handle region 410, which also may be referred to herein as a handle-proximate bearing surface 430, may press and/or bear against edge region 202 of the blade, thereby providing a motive force for insertion of the blade into the blade holder. Additionally or alternatively, probe blade 200 may be removed from the blade receptacle, such as via motion of the blade, or the corresponding blade-mounting region, away from and/or out of the blade receptacle. During such removal, bearing surface 430 that is relatively distal handle region 410, which also may be referred to herein as a handle-distal bearing surface 430, may press and/or bear against edge region 202 of the blade, thereby providing a motive force for removal of the blade from the blade holder.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B," when used in conjunction with open-ended language such as "comprising" may refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entities in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C," and "A, B, and/or C" may mean A alone, B alone, C alone, A and B together, A and C together, B and C together, A, B, and C together, and optionally any of the above in combination with at least one other entity.

In the event that any patents, patent applications, or other references are incorporated by reference herein and (1) define a term in a manner that is inconsistent with and/or (2) are otherwise inconsistent with, either the non-incorporated portion of the present disclosure or any of the other incorporated references, the non-incorporated portion of the present disclosure shall control, and the term or incorporated disclosure therein shall only control with respect to the reference in which the term is defined and/or the incorporated disclosure was present originally.

As used herein the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa.

As used herein, the phrase, "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/or methods, are also within the scope of the present disclosure.

As used herein, "at least substantially," when modifying a degree or relationship, may include not only the recited "substantial" degree or relationship, but also the full extent of the recited degree or relationship. A substantial amount of a recited degree or relationship may include at least 75% of the recited degree or relationship. For example, an object that is at least substantially formed from a material includes objects for which at least 75% of the objects are formed from the material and also includes objects that are completely formed from the material. As another example, a first length that is at least substantially as long as a second length includes first lengths that are within 75% of the second length and also includes first lengths that are as long as the second length.

Illustrative, non-exclusive examples of probes, probe blades, blade holders, probe systems and methods according to the present disclosure are presented in the following enumerated paragraphs. It is within the scope of the present disclosure that an individual step of a method recited herein, including in the following enumerated paragraphs, may additionally or alternatively be referred to as a "step for" performing the recited action.

A1. A probe for a probe system configured to electrically test a device under test (DUT), the probe comprising:
  a unitary probe body defined by an electrically conductive probe body material, wherein the unitary probe body includes:
    (i) a probe mount configured to be operatively attached to a probe blade;

(ii) a tip region that includes a probe tip configured to electrically contact the DUT; and (iii) a beam region that extends along a beam longitudinal axis between the probe mount and the tip region.

A2. The probe of paragraph A1, wherein the electrically conductive probe body material includes at least one of a metallic material, a semiconductor material, and a highly doped semiconductor material.

A3. The probe of any of paragraphs A1-A2, wherein the unitary probe body includes, or is, a planar, or an at least substantially planar, unitary probe body.

A4. The probe of any of paragraphs A1-A3, wherein the unitary probe body defines a first probe side, an opposed second probe side, and a probe thickness, or an average probe thickness, which is measured between the first probe side and the second probe side.

A5. The probe of paragraph A4, wherein at least one of:
(i) the first probe side is a planar, or an at least substantially planar, first probe side; and
(ii) the second probe side is a planar, or an at least substantially planar, second probe side.

A6. The probe of any of paragraphs A4-A5, wherein a ratio of a maximum extent of the probe to the probe thickness, or the average probe thickness, is within a threshold probe ratio range of at least one of:
(i) at least 20, at least 25, at least 30, at least 35, at least 40, at least 45, or at least 50; and
(ii) at most 200, at most 150, at most 100, at most 90, at most 80, at most 70, at most 60, at most 50, or at most 40.

A7. The probe of any of paragraphs A1-A6, wherein the probe mount is configured to at least one of:
(i) be welded to the probe blade;
(ii) be brazed to the probe blade;
(iii) be soldered to the probe blade; and
(iv) be adhered to the probe blade, optionally utilizing an electrically conductive adhesive material.

A8. The probe of any of paragraphs A1-A7, wherein the probe mount includes a mounting tab that projects away from the beam longitudinal axis along a tab projection axis.

A9. The probe of paragraph A8, wherein the tab projection axis is perpendicular, or at least substantially perpendicular, to the beam longitudinal axis.

A10. The probe of any of paragraphs A1-A9, wherein the probe mount includes a plurality of region apertures that extend through the unitary probe body and further extend perpendicular, or at least substantially perpendicular, to at least one of the beam longitudinal axis and the tab projection axis.

A11. The probe of any of paragraphs A1-A10, wherein the tip region includes a tip projection that projects from the beam region to the probe tip along a tip projection axis.

A12. The probe of paragraph A11, wherein the tip projection axis extends at a tip projection angle relative to the beam longitudinal axis, optionally wherein the tip projection angle is at least one of:
(i) at least 90 degrees, at least 100 degrees, at least 110 degrees, at least 120 degrees, at least 130 degrees, or at least 140 degrees; and
(ii) at most 160 degrees, at most 150 degrees, at most 140 degrees, at most 130 degrees, at most 120 degrees, at most 110 degrees, or at most 100 degrees.

A13. The probe of any of paragraphs A1-A12, wherein the probe mount extends from the beam region in a probe mount extension direction, and further wherein the tip region extends from the beam region in a tip region extension direction that is at least partially opposed to the probe mount extension direction.

A14. The probe of paragraph A13, wherein the tip region extension and the probe mount both extend away from the beam region in opposed, or at least partially opposed, directions.

A15. The probe of any of paragraphs A1-A14, wherein the beam region includes a plurality of elongate beams.

A16. The probe of paragraph A15, wherein each elongate beam of the plurality of elongate beams extends along the beam longitudinal axis and between the probe mount and the tip region.

A17. The probe of any of paragraphs A15-A16, wherein the plurality of elongate beams includes at least one of:
(i) at least 2, at least 3, at least 4, or at least 5 elongate beams,
(ii) at most 8, at most 6, or at most 4 elongate beams; and
(iii) 2, 3, 4, 5, or 6 elongate beams.

A18. The probe of any of paragraphs A15-A17, wherein each elongate beam of the plurality of elongate beams defines at least one of:
(i) a rectangular transverse cross-sectional shape;
(ii) an at least substantially rectangular transverse cross-sectional shape;
(iii) a square transverse cross-sectional shape; and
(iv) an at least substantially square transverse cross-sectional shape.

A19. The probe of any of paragraphs A1-A18, wherein the probe further includes a fiducial structure.

A20. The probe of paragraph A19, wherein the fiducial structure is at least partially defined on an upper surface of the probe.

A21. The probe of any of paragraphs A19-A20, wherein the fiducial structure is configured to be visible to an imaging device of the probe system during operative use of the probe system to electrically test the DUT.

A22. The probe of paragraph A21, wherein the fiducial structure is vertically, at least substantially vertically, or directly vertically, above the probe tip during operative use of the probe system to electrically test the DUT.

A23. The probe of any of paragraphs A19-A22, wherein the fiducial structure is at least one of:
(i) positioned in the tip region; and
(ii) proximate the tip region relative to the probe mount.

A24. The probe of any of paragraphs A19-A23, wherein a ratio of a fiducial-probe tip distance between the fiducial structure and the probe tip to a/the maximum extent of the probe is less than a threshold distance ratio, wherein the threshold distance ratio is 0.1, 0.08, 0.06, 0.04, 0.02, 0.01, 0.005, or 0.001.

A25. The probe of any of paragraphs A1-A24, wherein the probe is formed via a micro electrical mechanical systems (MEMS) machining process.

A26. A method of forming the probe of any of paragraphs A1-A25, the method comprising:
providing a MEMs substrate; and
utilizing at least one of a lithographic process, a deposition process, and an etch process to at least one of define the probe at least partially on the MEMs substrate and define the probe at least partially from the MEMs substrate.

B1. A probe blade for a probe system configured to electrically test a device under test (DUT), the probe blade comprising:

a dielectric blade body defined by a dielectric blade body material, wherein the dielectric blade body includes a blade-mounting region and a probe-mounting region;

a probe operatively attached to the probe-mounting region, wherein the probe includes a probe tip configured to electrically contact the DUT, optionally wherein the probe includes any suitable structure, function, and/or feature of any of the probes of any of paragraphs A1-A25; and an electrically conductive trace that extends between the blade-mounting region and the probe-mounting region and is in electrical communication with the probe within the probe-mounting region.

B2. The probe blade of paragraph B1, wherein the dielectric blade body material includes, or is, a ceramic dielectric blade body material.

B3. The probe blade of any of paragraphs B1-B2, wherein the dielectric blade body material differs from a/the electrically conductive probe body material of the probe.

B4. The probe blade of any of paragraphs B1-B3, wherein the dielectric blade body includes, or is, a planar, or an at least substantially planar, dielectric blade body.

B5. The probe blade of any of paragraphs B1-B4, wherein the dielectric blade body defines a first blade side, an opposed second blade side, and a blade thickness, or an average blade thickness, which is measured between the first blade side and the second blade side.

B6. The probe blade of paragraph B5, wherein at least one of:
(i) the first blade side is a planar, or an at least substantially planar, first blade side; and
(ii) the second blade side is a planar, or an at least substantially planar, second blade side.

B7. The probe blade of any of paragraphs B5-B6, wherein a ratio of a maximum extent of the blade to the blade thickness, or the average blade thickness, is within a threshold blade ratio range of at least one of:
(i) at least 20, at least 25, at least 30, at least 35, at least 40, at least 45, or at least 50; and
(ii) at most 200, at most 150, at most 100, at most 90, at most 80, at most 70, at most 60, at most 50, or at most 40.

B8. The probe blade of any of paragraphs B1-B7, wherein the dielectric blade body is at least one of:
(i) an L-shaped dielectric blade body; and
(ii) an at least partially L-shaped dielectric blade body.

B9. The probe blade of any of paragraphs B1-B8, wherein the blade-mounting region projects from a remainder of the dielectric blade body along a blade-mounting region axis and further wherein the probe-mounting region projects from a remainder of the dielectric blade body along a probe-mounting region axis that differs from the blade-mounting region axis.

B10. The probe blade of paragraph B9, wherein an angle of intersection between the blade-mounting region axis and the probe-mounting region axis is at least one of:
(i) at least 30 degrees, at least 40 degrees, at least 50 degrees, at least 60 degrees, at least 70 degrees, at least 80 degrees, at least 90 degrees, or at least 100 degrees; and
(ii) at most 150 degrees, at most 140 degrees, at most 130 degrees, at most 120 degrees, at most 110 degrees, at most 100 degrees, at most 90 degrees, or at most 80 degrees.

B11. The probe blade of any of paragraphs B9-B10, wherein the blade-mounting region axis and the probe-mounting region axis extend parallel to at least one of a/the first blade side of the dielectric blade body and a/the opposed second blade side of the dielectric blade body.

B12. The probe blade of any of paragraphs B1-B11, wherein the electrically conductive trace is defined by an electrically conductive trace material.

B13. The probe blade of paragraph B12, wherein the electrically conductive trace material differs from the dielectric blade body material.

B14. The probe blade of any of paragraphs B12-B13, wherein the electrically conductive trace material is a metallic electrically conductive trace material.

B15. The probe blade of any of paragraphs B1-B14, wherein the electrically conductive trace is at least one of:
(i) deposited on the dielectric blade body material;
(ii) adhered to the dielectric blade body material; and
(iii) operatively attached to the dielectric blade body material.

B16. The probe blade of any of paragraphs B1-B15, wherein the electrically conductive trace is an elongate electrically conductive trace.

B17. The probe blade of any of paragraphs B1-B16, wherein the electrically conductive trace is an at least partially planar electrically conductive trace.

B18. The probe blade of any of paragraphs B1-B17, wherein the probe is an electrically conductive probe.

B19. The probe blade of any of paragraphs B1-B18, wherein a/the probe mount of the probe is at least one of:
(i) welded to at least one of the probe-mounting region and the electrically conductive trace;
(ii) brazed to at least one of the probe-mounting region and the electrically conductive trace;
(iii) soldered to at least one of the probe-mounting region and the electrically conductive trace; and
(iv) adhered to at least one of the probe-mounting region and the electrically conductive trace, optionally utilizing an electrically conductive adhesive material.

B20. The probe blade of any of paragraphs B1-B19, wherein the electrically conductive trace extends at least partially, or even completely, along a/the first blade side of the dielectric blade body, and further wherein the probe blade includes an electrically conductive guard layer that extends on an/the opposed second blade side of the dielectric blade body.

B21. The probe blade of paragraph B20, wherein the opposed second blade side of the dielectric blade body defines a second side surface area and further wherein the electrically conductive guard layer defines a guard layer surface area that is a threshold surface area fraction of the second side surface area, wherein the threshold surface area fraction is at least 50%, at least 60%, at least 70%, at least 80%, at least 90%, or at least 95%.

B22. The probe blade of any of paragraphs B20-B21, wherein the electrically conductive guard layer is directly opposed to the electrically conductive trace along a threshold trace length fraction of a length of the electrically conductive trace, wherein the threshold trace length fraction is at least 70%, at least 75%, at least 80%, at least 85%, at least 90%, at least 95%, or at least 99%.

B23. The probe blade of any of paragraphs B20-B22, wherein the electrically conductive guard layer extends only on the opposed second blade side of the dielectric blade body.

B24. The probe blade of any of paragraphs B20-B23, wherein the electrically conductive guard layer is at least one of:
(i) electrically isolated from the electrically conductive trace via the dielectric blade body; and (ii) spaced-apart from the electrically conductive trace via the dielectric blade body along an entirety of a/the length of the electrically conductive trace.

B25. The probe blade of any of paragraphs B1-B24, wherein the electrically conductive trace is a first electrically conductive trace, or a force electrically conductive trace, and further wherein the probe blade includes a second electrically conductive trace, or a sense electrically conductive trace, that extends between the blade-mounting region and the probe-mounting region.

B26. The probe blade of paragraph B25, wherein the first electrically conductive trace and the second electrically conductive trace extend between the blade-mounting region and the probe-mounting region on the first blade side of the dielectric blade body.

B27. The probe blade of any of paragraphs B25-B26, wherein the probe blade is configured to provide a Kelvin, or a quasi-Kelvin, electrical connection with the DUT.

B28. The probe blade of any of paragraphs B25-B27, wherein a probe-proximate end of the second electrically conductive trace is shorted to a probe-proximate end of the first electrically conductive trace within the probe-mounting region.

B29. The probe blade of paragraph B28, wherein the second electrically conductive trace is spaced-apart from the first electrically conductive trace along a remainder of a length of the first electrically conductive trace.

B30. The probe blade of any of paragraphs B25-B29, wherein the probe blade is configured to provide a Kelvin, or a true Kelvin, electrical connection with the DUT.

B31. The probe blade of any of paragraphs B25-B30, wherein the probe is a first probe that includes a first probe tip, wherein the probe blade includes a second probe that is operatively attached to the probe-mounting region and includes a second probe tip configured to electrically contact the DUT, wherein the second electrically conductive trace is in electrical communication with the second probe within the probe-mounting region, and optionally wherein the second probe includes any suitable structure, function, and/or feature of any of the probes of any of paragraphs A1-A25.

B32. The probe blade of paragraph B31, wherein the first probe tip and the second probe tip are configured to electrically contact a single contact pad of the DUT.

B33. The probe blade of paragraph B32, wherein a distance between the first probe tip and the second probe tip is less than, or less than a threshold fraction of, a corresponding width of the single contact pad of the DUT, optionally wherein the threshold fraction is 80%, 70%, 60%, 50%, 40%, or 30%.

B34. The probe blade of any of paragraphs B31-B33, wherein a/the distance between the first probe tip and the second probe tip is less than a/the blade thickness of the probe blade.

B35. The probe blade of any of paragraphs B31-B34, wherein the first probe and the second probe taper toward one another as they extend away from the probe blade to facilitate electrical contact of both the first probe tip and the second probe tip with a/the single contact pad of the DUT.

B36. The probe blade of any of paragraphs B31-B35, wherein at least one of the first probe and the second probe is oriented at a probe extension angle relative to a corresponding one of a/the first blade side and a/the second blade side, optionally wherein the probe extension angle is at least one of:

(i) at least 0 degrees, at least 1 degree, at least 2 degrees, at least 4 degrees, at least 6 degrees, at least 8 degrees, at least 10 degrees, at least 12 degrees, or at least 14 degrees; and (ii) at most 20 degrees, at most 18 degrees, at most 16 degrees, at most 14 degrees, at most 12 degrees, at most 10 degrees, at most 8 degrees, at most 6 degrees, or at most 4 degrees.

B37. The probe blade of any of paragraphs B31-B36, wherein the first electrically conductive trace includes a first trace extension region, which is defined on an attachment surface of the probe blade, wherein the second electrically conductive trace includes a second trace extension region, which is defined on the attachment surface, wherein the first probe is operatively attached to the first trace extension region, and further wherein the second probe is operatively attached to the second trace extension region, optionally wherein the attachment surface extends between a/the first blade side and a/the second blade side of the probe blade.

B38. The probe blade of any of paragraphs B31-B37, wherein:

(i) the first probe tip of the first probe is relatively proximate a side of the first probe that faces toward the second probe when compared to a side of the first probe that faces away from the second probe; and (ii) the second probe tip of the second probe is relatively proximate a side of the second probe that faces toward the first probe when compared to a side of the second probe that faces away from the first probe.

B39. The probe blade of any of paragraphs B31-B38, wherein the second electrically conductive trace is at least one of:

(i) spaced apart from the first electrically conductive trace, via the dielectric blade body, along an entirety of a/the length of the first electrically conductive trace; and (ii) electrically isolated from the first electrically conductive trace via the dielectric blade body.

B40. The probe blade of any of paragraphs B1-B39, wherein the probe blade further includes a clearance region that extends away from the probe and is shaped to provide additional clearance for the probe to contact the DUT.

B41. The probe blade of any of paragraphs B1-B40, wherein the probe blade includes an alignment structure configured to engage with a blade holder when the probe blade is received within a blade-receiving region of the blade holder.

B42. The probe blade of paragraph B41, wherein the alignment structure includes a notch that extends into the probe blade and is configured to receive a region of the blade holder to facilitate consistent alignment between the probe blade and the blade holder.

B43. The probe blade of any of paragraphs B41-B42, wherein the alignment structure includes a protrusion that extends from an edge region of the probe blade and is configured to extend around a region of the blade holder to facilitate consistent alignment between the probe blade and the blade holder.

C1. A blade holder configured to separably and operatively attach a probe blade to a probe system, the blade holder comprising:

an electrically conductive holder housing that defines:

(i) a blade-receiving region configured to receive a blade-mounting region of the probe blade;

(ii) an electrical connection region configured to receive a plurality of electrical connections;

(iii) a housing-mounting region configured to operatively attach the electrically conductive holder housing to the probe system; and (iv) an at least partially enclosed housing volume that extends between the blade-receiving region and the electrical connection region;

a blade-contacting structure at least partially positioned within the blade-receiving region, wherein the blade-contacting structure includes a force blade contact, which is configured to electrically contact a force electrically conductive trace of the probe blade, and a sense blade contact, which is configured to electrically contact a sense electrically conductive trace of the probe blade;

a ground electrical connection to the electrical connection region, wherein the ground electrical connection is in electrical communication with the electrically conductive holder housing;

a force electrical connection within the electrical connection region, wherein the force electrical connection is electrically isolated from the electrically conductive holder housing;

a force conductor that extends within the housing volume, is electrically isolated from the electrically conductive holder housing, and electrically interconnects the force electrical connection with the force blade contact;

a sense electrical connection to the electrical connection region, wherein the sense electrical connection is electrically isolated from both the electrically conductive holder housing and the force electrical connection; and a sense conductor that extends within the housing volume, is electrically isolated from both the electrically conductive holder housing and the force conductor, and electrically interconnects the sense electrical connection with the sense blade contact.

C2. The blade holder of paragraph C1, wherein the electrically conductive holder housing is a metallic electrically conductive holder housing.

C3. The blade holder of any of paragraphs C1-C2, wherein the electrically conductive holder housing is a unitary electrically conductive holder housing.

C4. The blade holder of any of paragraphs C1-C3, wherein the blade-receiving region defines a rectangular, or at least partially rectangular, transverse cross-section.

C5. The blade holder of any of paragraphs C1-C4, wherein the blade-receiving region is shaped and sized to receive the blade-mounting region of the probe blade.

C6. The blade holder of any of paragraphs C1-C5, wherein the electrical connection region includes a force connection aperture configured to receive the force electrical connection and a sense connection aperture configured to receive the sense electrical connection, wherein the force connection aperture and the sense connection aperture extend into the enclosed housing volume.

C7. The blade holder of any of paragraphs C1-C6, wherein the housing-mounting region includes a housing-mounting projection that projects from a remainder of the electrically conductive holder housing.

C8. The blade holder of any of paragraphs C1-C7, wherein the housing volume is at least partially enclosed on at least three, at least four, or at least five sides.

C9. The blade holder of any of paragraphs C1-C8, wherein the blade-contacting structure is a biased blade-contacting structure configured to operatively retain the probe blade within the blade-receiving region.

C10. The blade holder of any of paragraphs C1-C9, wherein at least one of:

(i) the force blade contact includes a resilient force blade contact configured to be deformed to permit the blade-mounting region of the probe blade to be received within the blade-receiving region; and (ii) the sense blade contact includes a resilient sense blade contact configured to be deformed to permit the blade-mounting region of the probe blade to be received within the blade-receiving region.

C11. The blade holder of any of paragraphs C1-C10, wherein the force electrically conductive trace and the sense electrically conductive trace are positioned on a first blade side of the probe blade, wherein the probe blade further includes an electrically conductive guard layer positioned on a second blade side of the probe blade, and further wherein the blade-contacting structure is configured to urge the electrically conductive guard layer into electrical contact with an internal surface of the blade-receiving region that is at least partially defined by the electrically conductive holder housing such that the electrically conductive guard layer is in electrical communication with the electrically conductive holder housing.

C12. The blade holder of any of paragraphs C1-C11, wherein the force electrical connection is defined by an inner conductor of a force coaxial connector, and further wherein the ground electrical connection is at least partially defined by an outer conductor of the force coaxial connector.

C13. The blade holder of any of paragraphs C1-C12, wherein the sense electrical connection is defined by an inner conductor of a sense coaxial connector, and further wherein the ground electrical connection is at least partially defined by an outer conductor of the sense coaxial connector.

C14. The blade holder of any of paragraphs C1-C13, wherein the blade holder includes the probe blade, optionally wherein the probe blade includes any suitable structure, function, and/or feature of any of the probe blades of any of paragraphs B1-B43.

C15. The blade holder of any of paragraphs C1-C14, wherein the blade holder further includes a blade holder mounting plate operatively attached to the housing-mounting region of the electrically conductive holder housing.

C16. The blade holder of paragraph C15, wherein the blade holder mounting plate and the housing-mounting region together are keyed to permit only a single relative orientation therebetween.

C17. The blade holder of any of paragraphs C15-C16, wherein the blade holder further includes a probe arm configured to operatively attach the blade holder mounting plate to a remainder of the probe system.

C18. The blade holder of paragraph C17, wherein the probe arm and the blade holder mounting plate together are keyed to permit only a single relative orientation therebetween.

D1. A probe system configured to electrically test a device under test (DUT), the probe system comprising at least one of:

a chuck that defines a support surface configured to support a substrate that includes the DUT;

a probe assembly that includes at least one of:
(i) the probe of any of paragraphs A1-A25;
(ii) the probe blade of any of paragraphs B1-B43; and
(iii) the blade holder of any of paragraphs C1-C17;

a manipulator configured to move the probe assembly relative to the support surface;

a signal generation and analysis assembly configured to:
(i) provide a force signal to the DUT via the probe assembly; and (ii) receive a sense signal from the DUT via the probe assembly; and an imaging device configured to collect an optical image of at least one of:
(i) at least one other component of the probe system; and
(ii) the DUT.

E1. A tool configured to facilitate insertion of a probe blade into a blade holder and removal of the probe blade from the blade holder, the tool comprising:
a handle region configured to be gripped by a user of the tool;
a blade receptacle shaped to receive at least a region of the probe blade;
a bearing surface that at least partially defines the blade receptacle and is shaped to press against an edge region of the blade; and
a blade gripping structure configured to be selectively actuated by the user to grip the probe blade.

E2. The tool of paragraph E1, wherein the tool includes a plurality of bearing surfaces including:
(i) a handle-proximate bearing surface that is relatively proximate the handle region and is configured to press against the edge region when the tool is utilized to insert the probe blade into the blade holder; and
(ii) a handle-distal bearing surface that is relatively distal the handle region and is configured to press against the edge region when the tool is utilized to remove the probe blade from the blade holder.

E3. The tool of any of paragraphs E1-E2, wherein the blade gripping structure includes a resilient structure that is configured to be selectively squeezed by the user to cause the blade gripping structure to selectively grip the probe blade.

E4. The tool of any of paragraphs E1-E3, wherein the blade gripping structure is configured to selectively grip the probe blade via selective application of a compressive gripping force between a first blade side of the blade and a second blade side of the blade, optionally wherein the edge region of the blade extends between the first blade side and the second blade side.

F1. A kit of components configured to be utilized with a probe assembly of a probe system, the kit comprising at least one, and optionally both, of:
at least one probe blade, optionally wherein the at least one probe blade includes any suitable structure, function, and/or feature of any of the probe blades of any of paragraphs B1-B43; and
at least one tool configured to facilitate insertion of the at least one probe blade into a blade holder of the probe assembly and removal of the at least one probe blade from the blade holder, optionally wherein the at least one tool includes any suitable structure, function, and/or feature of any of the tools of any of paragraphs E1-E4.

F2. The kit of paragraph F1, wherein the kit includes a plurality of tools, including a left-handed tool, which is configured to facilitate insertion and removal of the at least one probe blade from a left side of the at least one probe blade, and a right-handed tool, which is configured to facilitate insertion and removal of the at least one probe blade from a right side of the at least one probe blade.

F3. The kit of any of paragraphs F1-F2, wherein the kit further includes a blade holder, optionally wherein the blade holder includes any suitable structure, function, and/or feature of any of the blade holders of any of paragraphs C1-C18.

INDUSTRIAL APPLICABILITY

The probes, probe blades, blade holders, probe systems, and methods disclosed herein are applicable to the semiconductor manufacturing and test industries.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

The invention claimed is:

1. A probe blade for a probe system configured to electrically test a device under test (DUT), the probe blade comprising:
a dielectric blade body defined by a dielectric blade body material, wherein the dielectric blade body includes a blade-mounting region and a probe-mounting region and defines a first blade side and an opposed second blade side;
a probe operatively attached to the probe-mounting region, wherein the probe includes a probe tip configured to electrically contact the DUT;
a force electrically conductive trace that extends on the first blade side, between the blade-mounting region and the probe-mounting region, wherein the force electrically conductive trace is in electrical communication with the probe within the probe-mounting region;
a sense electrically conductive trace that extends on the first blade side between the blade-mounting region and the probe-mounting region; and
an electrically conductive guard layer that extends on the opposed second blade side;
wherein the probe blade is configured to provide a Kelvin electrical connection with the DUT;
wherein the probe is a first probe that includes a first probe tip;
wherein the probe blade includes a second probe that is operatively attached to the probe-mounting region and includes a second probe tip configured to electrically contact the DUT;
wherein the sense electrically conductive trace is in electrical communication with the second probe within the probe-mounting region; and
further wherein the Kelvin electrical connection is a true Kelvin electrical connection.

2. The probe blade of claim 1, wherein the first probe tip and the second probe tip are configured to electrically contact a single contact pad of the DUT, and further wherein a distance between the first probe tip and the second probe tip is less than a corresponding width of the single contact pad of the DUT.

3. The probe blade of claim 1, wherein a distance between the first probe tip and the second probe tip is less than a blade thickness of the probe blade.

4. The probe blade of claim 1, wherein the first probe and the second probe taper toward one another as they extend away from the probe blade to facilitate electrical contact of both the first probe tip and the second probe tip with a single contact pad of the DUT.

5. The probe blade of claim 1, wherein at least one of the first probe and the second probe is oriented at a probe extension angle relative to a corresponding one of the first blade side and the second blade side, wherein the probe extension angle is at least 0 degrees and at most 20 degrees.

6. The probe blade of claim 1, wherein the force electrically conductive trace includes a first trace extension region, which is defined on an attachment surface of the probe blade, wherein the sense electrically conductive trace includes a second trace extension region, which is defined on the attachment surface, wherein the attachment surface extends between the first blade side and the second blade side of the probe blade, wherein the force electrically conductive trace wraps over an edge of the first blade side and onto the attachment surface, wherein the first probe is operatively attached to the first trace extension region, and further wherein the second probe is operatively attached to the second trace extension region.

7. The probe blade of claim 1, wherein:
(i) the first probe tip of the first probe is relatively proximate a side of the first probe that faces toward the second probe when compared to a side of the first probe that faces away from the second probe; and
(ii) the second probe tip of the second probe is relatively proximate a side of the second probe that faces toward the first probe when compared to a side of the second probe that faces away from the first probe.

8. The probe blade of claim 1, wherein the probe blade includes an alignment structure configured to engage with a blade holder when the probe blade is received within a blade-receiving region of the blade holder.

9. The probe blade of claim 8, wherein the alignment structure includes a notch that extends into the probe blade and is configured to receive a region of the blade holder to facilitate consistent alignment between the probe blade and the blade holder.

10. The probe blade of claim 8, wherein the alignment structure includes a protrusion that extends from an edge region of the probe blade and is configured to extend around a region of the blade holder to facilitate consistent alignment between the probe blade and the blade holder.

11. The probe blade of claim 1, wherein the probe blade further includes a clearance region that extends away from the probe and is shaped to provide additional clearance for the probe to contact the DUT.

12. The probe blade of claim 1, wherein the opposed second blade side defines a second side surface area, and further wherein the electrically conductive guard layer defines a guard layer surface area that is at least 50% of the second side surface area.

13. The probe blade of claim 1, wherein the dielectric blade body material differs from an electrically conductive probe body material of the probe.

14. The probe blade of claim 1, wherein the dielectric blade body is an at least partially L-shaped dielectric blade body.

15. A blade holder, comprising:
the probe blade of claim 1, wherein the blade holder is configured to separably and operatively attach the probe blade to a probe system;
an electrically conductive holder housing that defines:
(i) a blade-receiving region configured to receive the blade-mounting region of the probe blade;
(ii) an electrical connection region configured to receive a plurality of electrical connections;
(iii) a housing-mounting region configured to operatively attach the electrically conductive holder housing to the probe system; and
(iv) an at least partially enclosed housing volume that extends between the blade-receiving region and the electrical connection region;
a blade-contacting structure at least partially positioned within the blade-receiving region, wherein the blade-contacting structure includes a force blade contact, which is configured to electrically contact the force electrically conductive trace, and a sense blade contact, which is configured to electrically contact the sense electrically conductive trace;
a ground electrical connection to the electrical connection region, wherein the ground electrical connection is in electrical communication with the electrically conductive holder housing;
a force electrical connection within the electrical connection region, wherein the force electrical connection is electrically isolated from the electrically conductive holder housing;
a force conductor that extends within the housing volume, is electrically isolated from the electrically conductive holder housing, and electrically interconnects the force electrical connection with the force blade contact;
a sense electrical connection to the electrical connection region, wherein the sense electrical connection is electrically isolated from both the electrically conductive holder housing and the force electrical connection; and
a sense conductor that extends within the housing volume, is electrically isolated from both the electrically conductive holder housing and the force conductor, and electrically interconnects the sense electrical connection with the sense blade contact.

16. The blade holder of claim 15, wherein the blade-contacting structure is a biased blade-contacting structure configured to operatively retain the probe blade within the blade-receiving region.

17. The blade holder of claim 15, wherein the blade-contacting structure is configured to urge the electrically conductive guard layer into electrical contact with an internal surface of the blade-receiving region that is at least partially defined by the electrically conductive holder housing such that the electrically conductive guard layer is in electrical communication with the electrically conductive holder housing.

18. A probe system configured to electrically test a device under test (DUT), the probe system comprising:
a chuck that defines a support surface configured to support a substrate that includes the DUT;
a probe assembly that includes the blade holder of claim 15;
a manipulator configured to move the probe assembly relative to the support surface;
a signal generation and analysis assembly configured to:

(i) provide a force signal to the DUT via the probe assembly; and
(ii) receive a sense signal from the DUT via the probe assembly; and
an imaging device configured to collect an optical image of at least one of:
(i) at least one other component of the probe system; and
(ii) the DUT.

19. A kit of components configured to be utilized with a probe assembly of a probe system, the kit comprising:
the probe blade of claim 1; and
a tool configured to facilitate insertion of the probe blade into a blade holder and removal of the probe blade from the blade holder, wherein the tool includes:
(i) a handle region configured to be gripped by a user of the tool;
(ii) a blade receptacle shaped to receive at least a region of the probe blade;
(iii) a bearing surface that at least partially defines the blade receptacle and is shaped to press against an edge region of the blade; and
(iv) a blade gripping structure configured to be selectively actuated by the user to grip the probe blade.

20. The probe blade of claim 1, wherein the dielectric blade body is a single dielectric blade body that defines the probe-mounting region and to which the first probe and the second probe both are operatively attached.

21. The probe blade of claim 1, wherein the dielectric blade body defines an average blade thickness, which is measured between the first blade side and the second blade side, wherein the first blade side is an at least substantially planar first blade side, wherein the second blade side is a an at least substantially planar second blade side, and further wherein a ratio of a maximum extent of the blade to the average blade thickness is within a threshold blade ratio range of at least one of at least 20 and at most 200.

22. A blade holder configured to separably and operatively attach a probe blade to a probe system, the blade holder comprising:
an electrically conductive holder housing that defines:
(i) a blade-receiving region configured to receive a blade-mounting region of the probe blade;
(ii) an electrical connection region configured to receive a plurality of electrical connections;
(iii) a housing-mounting region configured to operatively attach the electrically conductive holder housing to the probe system; and
(iv) an at least partially enclosed housing volume that extends between the blade-receiving region and the electrical connection region;
a blade-contacting structure at least partially positioned within the blade-receiving region, wherein the blade-contacting structure includes a force blade contact, which is configured to electrically contact a force electrically conductive trace of the probe blade, and a sense blade contact, which is configured to electrically contact a sense electrically conductive trace of the probe blade;
a ground electrical connection to the electrical connection region, wherein the ground electrical connection is in electrical communication with the electrically conductive holder housing;
a force electrical connection within the electrical connection region, wherein the force electrical connection is electrically isolated from the electrically conductive holder housing;
a force conductor that extends within the housing volume, is electrically isolated from the electrically conductive holder housing, and electrically interconnects the force electrical connection with the force blade contact;
a sense electrical connection to the electrical connection region, wherein the sense electrical connection is electrically isolated from both the electrically conductive holder housing and the force electrical connection; and
a sense conductor that extends within the housing volume, is electrically isolated from both the electrically conductive holder housing and the force conductor, and electrically interconnects the sense electrical connection with the sense blade contact.

23. The blade holder of claim 22, wherein the force blade contact is electrically isolated from the sense blade contact, wherein the force conductor is electrically isolated from the electrically conductive holder housing within an entirety of the blade holder, and further wherein the sense conductor is electrically isolated from both the electrically conductive holder housing and the force conductor within an entirety of the blade holder.

24. A kit of components configured to be utilized with a probe assembly of a probe system configured to electrically test a device under test (DUT), the kit comprising:
a probe blade comprising:
(i) a dielectric blade body defined by a dielectric blade body material, wherein the dielectric blade body includes a blade-mounting region and a probe-mounting region and defines a first blade side and an opposed second blade side;
(ii) a probe operatively attached to the probe-mounting region, wherein the probe includes a probe tip configured to electrically contact the DUT;
(iii) a force electrically conductive trace that extends on the first blade side, between the blade-mounting region and the probe-mounting region, wherein the force electrically conductive trace is in electrical communication with the probe within the probe-mounting region;
(iv) a sense electrically conductive trace that extends on the first blade side between the blade-mounting region and the probe-mounting region; and
(v) an electrically conductive guard layer that extends on the opposed second blade side;
wherein the probe blade is configured to provide a Kelvin electrical connection with the DUT; and
a tool configured to facilitate insertion of the probe blade into a blade holder and removal of the probe blade from the blade holder, wherein the tool includes:
(i) a handle region configured to be gripped by a user of the tool;
(ii) a blade receptacle shaped to receive at least a region of the probe blade;
(iii) a bearing surface that at least partially defines the blade receptacle and is shaped to press against an edge region of the blade; and
(iv) a blade gripping structure configured to be selectively actuated by the user to grip the probe blade.

* * * * *

UNITED STATES PATENT AND TRADEMARK OFFICE
CERTIFICATE OF CORRECTION

| | | |
|---|---|---|
| PATENT NO. | : 12,379,395 B2 | Page 1 of 1 |
| APPLICATION NO. | : 18/762393 | |
| DATED | : August 5, 2025 | |
| INVENTOR(S) | : Choon Beng Sia et al. | |

It is certified that error appears in the above-identified patent and that said Letters Patent is hereby corrected as shown below:

In the Claims

In Claim 21, Column 33, Line 33, please delete the word "a".

Signed and Sealed this
Twenty-eighth Day of October, 2025

John A. Squires
*Director of the United States Patent and Trademark Office*